(12) United States Patent
Hassan et al.

(10) Patent No.: US 10,084,483 B2
(45) Date of Patent: Sep. 25, 2018

(54) INTERLEAVING INFORMATION FOR MEDIA DATA

(71) Applicant: Microsoft Technology Licensing, LLC, Redmond, WA (US)

(72) Inventors: Amer Aref Hassan, Kirkland, WA (US); Andrew Nicholas Paul Smith, London (GB)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/818,609

(22) Filed: Aug. 5, 2015

(65) Prior Publication Data

US 2017/0041026 A1    Feb. 9, 2017

(51) Int. Cl.
| | | |
|---|---|---|
| *H03M 13/27* | (2006.01) | |
| *H04L 1/00* | (2006.01) | |
| *H03M 13/35* | (2006.01) | |
| *H04L 29/06* | (2006.01) | |

(52) U.S. Cl.
CPC ..... *H03M 13/2792* (2013.01); *H03M 13/353* (2013.01); *H04L 1/0009* (2013.01); *H04L 1/0018* (2013.01); *H04L 1/0071* (2013.01); *H04L 65/607* (2013.01)

(58) Field of Classification Search
CPC ............ H03M 13/2792; H03M 13/353; H04L 65/607
See application file for complete search history.

(56) References Cited

U.S. PATENT DOCUMENTS

| | | | |
|---|---|---|---|
| 5,602,831 A | 2/1997 | Gaskill | |
| 5,828,954 A * | 10/1998 | Wang | H04H 20/57 455/260 |
| 6,198,748 B1 | 3/2001 | Bruckert | |
| 6,614,767 B1 | 9/2003 | Marko et al. | |
| 6,959,048 B1 * | 10/2005 | Horneman | H04B 7/0613 375/299 |
| 7,729,438 B2 | 6/2010 | Ouyang et al. | |
| 7,773,708 B2 | 8/2010 | Parantainen | |
| 2002/0016938 A1 | 2/2002 | Starr | |
| 2002/0044612 A1* | 4/2002 | Sipola | H03M 13/2707 375/295 |
| 2002/0087923 A1 | 7/2002 | Eroz et al. | |
| 2005/0025040 A1 | 2/2005 | Tang et al. | |

(Continued)

FOREIGN PATENT DOCUMENTS

EP    1953929 A2    8/2008

OTHER PUBLICATIONS

Botta,"Packet Interleaving from Theory to Practice", Retrieved from <http://www.researchgate.net/publication/228779959_Packet_interleaving_from_theory_to_practice> on Jun. 23, 2015, 2009, 29 pages.

(Continued)

*Primary Examiner* — April Ying Shan Blair
*Assistant Examiner* — Rong Tang

(57) ABSTRACT

Techniques for interleaving information for media data are described. In at least some embodiments, interleaving information is propagated from a network-based service to endpoint devices that participate in communication sessions. The endpoint devices may utilize the interleaving information to interleave media data of communication sessions.

20 Claims, 14 Drawing Sheets

(56) References Cited

U.S. PATENT DOCUMENTS

| | | |
|---|---|---|
| 2005/0157685 A1 | 7/2005 | Gu et al. |
| 2005/0283706 A1* | 12/2005 | Heise ................ H03M 13/2732 |
| | | 714/755 |
| 2006/0092873 A1 | 5/2006 | Khayrallah |
| 2007/0143498 A1 | 6/2007 | Uhlemann |
| 2009/0028259 A1 | 1/2009 | Yu et al. |
| 2009/0296850 A1 | 12/2009 | Xu et al. |
| 2010/0332941 A1* | 12/2010 | Gilson .................. H04L 1/0001 |
| | | 714/762 |
| 2011/0142157 A1 | 6/2011 | Choi et al. |
| 2013/0044028 A1 | 2/2013 | Lea et al. |
| 2014/0119284 A1 | 5/2014 | Baldemair et al. |

OTHER PUBLICATIONS

Cai,"Switched Interleaving Techniques with Limited Feedback for Interference Mitigation in DS-CDMA Systems", In Proceedings of IEEE Transactions on Communications, Jul. 2011, 25 pages.

Hasimoto-Beltran,"Pixel Level Interleaving Schemes for Robust Image Communication", In Proceedings of Seventeenth IEEE Symposium on Reliable Distributed Systems, Oct. 20, 1998, 6 pages.

Mathuranathan,"Interleavers and Deinterleavers", gaussian Waves—signal processing simplified, Oct. 25, 2010, 10 pages.

"International Search Report and Written Opinion Issued in PCT Application No. PCT/US2016/044136", dated Feb. 22, 2017, 19 Pages.

"International Preliminary Report on Patentability Issued in PCT Application No. PCT/US2016/044136", dated Sep. 11, 2017, 11 Pages.

\* cited by examiner

200

| Media Type | Default Depth | Max Depth | NW Type | Mode |
|---|---|---|---|---|
| Voice | D1 | M1 | N1 | X1 |
| Video | D2 | M2 | N1 | X1 |
| File Sharing | D3 | M3 | N1 | X1 |
| Text | D3 | M3 | N1 | X1 |
| Voice | D1 | M1 | N2 | X2 |
| Video | D2 | M2 | N2 | X2 |
| File Sharing | D3 | M3 | N2 | X2 |
| Text | D3 | M3 | N2 | X2 |
| Version: 8.01.2015.13:24:08 | | | | |

202 — Media Type; 204 — Default Depth; 206 — Max Depth; 208 — NW Type; 210 — Mode; 212 — Version

Fig. 2

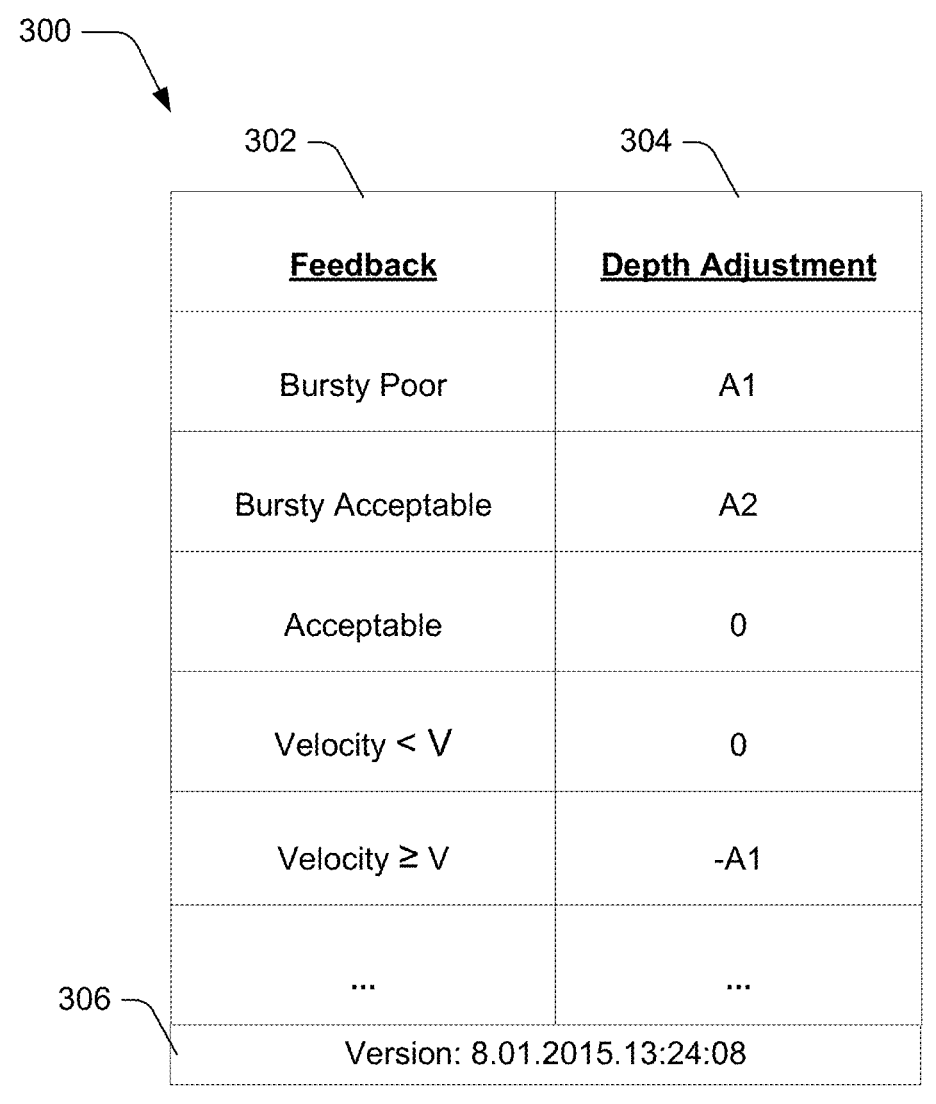

| Feedback | Depth Adjustment |
|---|---|
| Bursty Poor | A1 |
| Bursty Acceptable | A2 |
| Acceptable | 0 |
| Velocity < V | 0 |
| Velocity ≥ V | -A1 |
| ... | ... |
| Version: 8.01.2015.13:24:08 | |

Fig. 3

INTERLEAVING INFORMATION FOR MEDIA DATA

BACKGROUND

Modern communication systems have an array of capabilities, including integration of various communication modalities with different services. For example, voice/video communications, instant messaging, data/application sharing, white-boarding, and other forms of communication may be combined with presence and availability information for users. Such systems enable users to engage in communication sessions to exchange different types of communication media, such as voice data, video data, content sharing, and combinations thereof. Furthermore, collaboration systems that enable users to share and collaborate in creating and modifying various types of documents and content may be integrated with multimodal communication systems providing different kinds of communication and collaboration capabilities. Such integrated systems are sometimes referred to as Unified Communication (UC) systems.

While UC systems provide for increased flexibility in communications, they also present a number of implementation challenges. For instance, typical data encoding techniques used for wireless transmission of data are static and are not designed to account for the dynamic nature of UC data. Further, UC is typically implemented via software that can be loaded on mobile devices, e.g., tablets, smartphones, laptops, and so forth. Thus, techniques for managing UC communication traffic typically have to be fluid and dynamic to accommodate changing connection scenarios.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques for interleaving information for media data are described. In at least some embodiments, interleaving information is propagated from a network-based service to endpoint devices that participate in communication sessions. The endpoint devices may utilize the interleaving information to interleave media data of communication sessions.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIG. 2 depicts an example interleaving table in accordance with one or more embodiments.

FIG. 3 depicts an example adjustment table in accordance with one or more embodiments.

DETAILED DESCRIPTION

Overview

Figure 1:
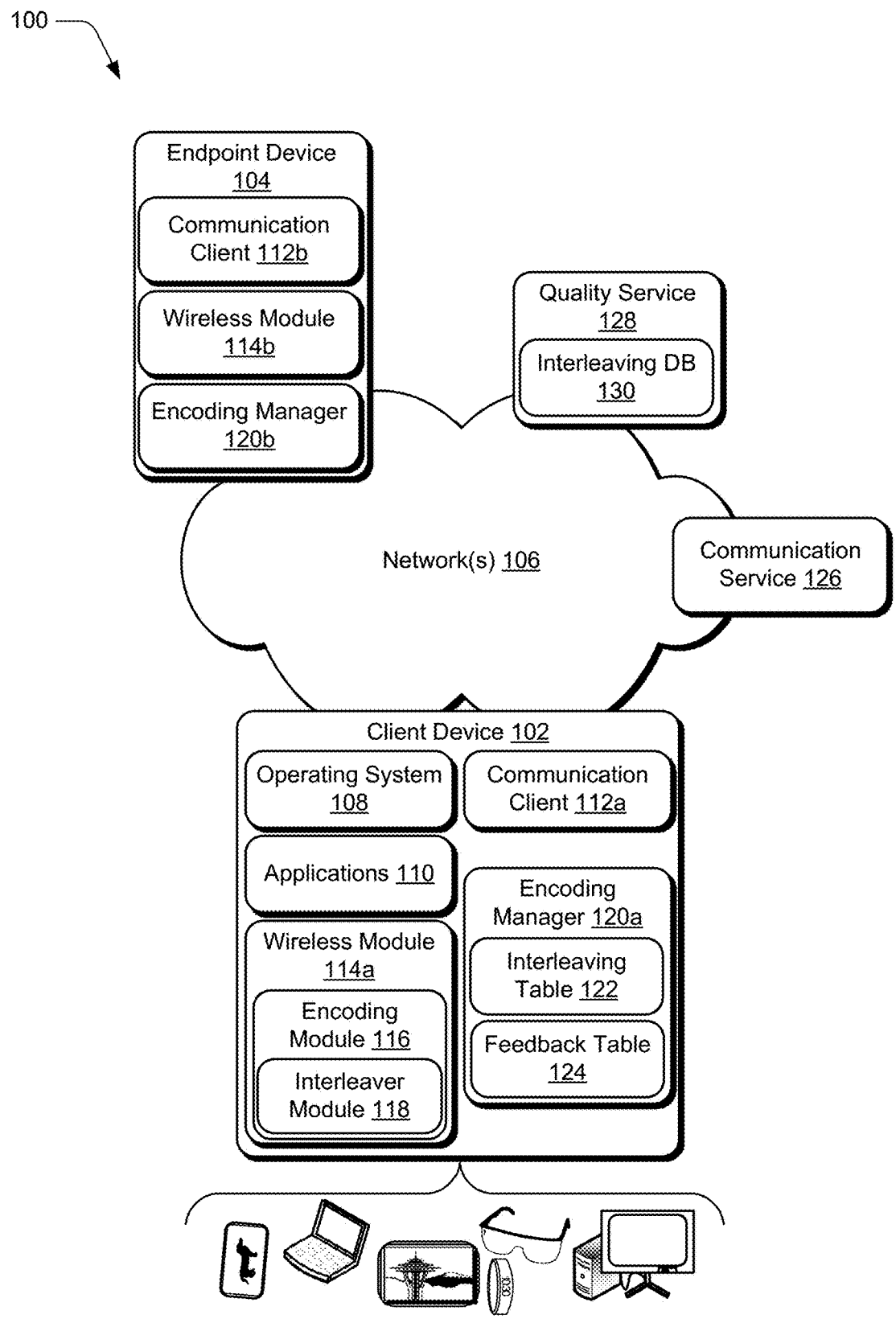
FIG. 1 is an illustration of an environment in an example implementation that is operable to employ techniques discussed herein.

Techniques for interleaving information for media data are described. According to various implementations, interleaving refers to different procedures for shuffling bits of a data stream that is to be transmitted, such as over a wired and/or wireless network. Generally, interleaving mitigates the effects of bursty errors that may be introduced into data that is transmitted wirelessly, such as errors caused by interference or multipath that affect a wireless signal.

According to various implementations, interleaving information is propagated from a network-based service to endpoint devices that participate in communication sessions. The interleaving information, for instance, includes interleaving depth values that are specific to particular media types, as well as interleaver modes for interleaving media data. Generally, a communication session refers to an exchange of communication media between communication endpoints, such as a real-time communication session between users of different communication endpoints. Examples of a communication session include a Voice over Internet Protocol (VoIP) call, a video call, text messaging, a file transfer, and/or combinations thereof. A communication session, for instance, is typically implemented via Internet Protocol (IP). In at least some implementations, a communication session represents a Unified Communications (UC) session.

In an example implementation, a client device receives interleaving information from a network-based service, such as a cloud-based quality service. Accordingly, the client device utilizes the interleaving information to interleave media data. For instance, consider that the client device is participating in a communication session with one or more other devices via a data connection to a wireless network. The client device processes data to be transmitted as part of the communication session in various ways. For instance, the client device applies error coding to the data, such as forward error correction (FEC). Further, the client device interleaves the data utilizing the interleaving information received from the network-based service. For instance, the client device interleaves the data using any suitable interleaving mode. Examples of different interleaving modes include block interleaving, convolutional interleaving, random interleaving, and so forth. According to various implementations, a depth value used to interleave the data is selected from the interleaving information based on a media type included in the communication session. For instance, the interleaving information specifies different interleaving depths for different media types.

In at least some implementations, an interleaver depth for a particular media type is selected based on a delay tolerance for the media type. For instance, voice data typically has a lower delay tolerance than file transfer data, and thus voice data may have a lower interleaver depth than file transfer data.

Accordingly, data of the communication session is interleaved using the selected interleaver depth to generate an interleaved data stream. The interleaved data stream is then transmitted wirelessly from a client device to an endpoint device involved in the communication session. The endpoint device decodes the interleaved data stream to extract data (e.g., media data) of the communication session. The endpoint device also inspects the data for errors and other attributes, and generates feedback for the data stream. The feedback, for instance, indicates a general quality of the data stream, and/or includes error statistics for the data stream. The endpoint device communicates the feedback to the client device. Based on the feedback, the client device may perform various actions, such as increasing the interleaver depth to mitigate errors caused by interference in wireless transmission, adjusting error coding rate for data of the communication session, and so forth.

In at least some implementations, an interleaving mode is adjusting based on a change in network connectivity, such as changes in radio channel characteristics for a radio channel being used to transmit data of a communication session. For instance, if network connectivity changes from one wireless network to a different wireless network during a communication session, an interleaving mode is adjusted to accommodate the different wireless network. As an example, an interleaving mode that is better suited to a wireless technology utilized by the different wireless network is selected. Thus, interleaving mode may be dynamically adjusted to accommodate changes in network connectivity.

Thus, implementations discussed herein provide for network-based propagation of interleaving information to devices that participate in communication sessions. The interleaving information can be used to dynamically adjust interleaving and encoding for data to be transmitted wirelessly as part of a communication session. Such dynamic adjustment optimizes session performance by increasing signal quality, decreasing and/or distributing signal errors, and so forth. Thus, user experience during a communication session is enhanced. Further, allowing a network-based service to generate and propagate interleaving information reduces processing load and battery usage on endpoint devices that participate in communication sessions.

In the following discussion, an example environment is first described that is operable to employ techniques described herein. Next, a section entitled "Example Implementation Scenario" describes an example implementation scenario in accordance with one or more embodiments. Following this, a section entitled "Example Procedures" describes some example procedures in accordance with one or more embodiments. Finally, a section entitled "Example System and Device" describes an example system and device that are operable to employ techniques discussed herein in accordance with one or more embodiments.

Having presented an overview of example implementations in accordance with one or more embodiments, consider now an example environment in which example implementations may by employed.

Example Environment

FIG. 1 is an illustration of an environment 100 in an example implementation that is operable to employ techniques interleaving information for media data described herein. Generally, the environment 100 includes various devices, services, and networks that enable communication via a variety of different modalities. For instance, the environment 100 includes a client device 102 and an endpoint device 104 connected to a network 106. The client device 102 and the endpoint device 104 may be configured in a variety of ways, such as a traditional computer (e.g., a desktop personal computer, laptop computer, and so on), a mobile station, an entertainment appliance, a smartphone, a wearable device, a netbook, a game console, a handheld device (e.g., a tablet), and so forth.

The network 106 is representative of a network that provides the client device 102 and the endpoint device 104 with connectivity to various networks and/or services, such as the Internet. The network 106, for instance, enables data to be transmitted wirelessly between the client device 102 and the endpoint device 104. The network 106 may be implemented via a variety of different connectivity technologies, such as broadband cable, digital subscriber line (DSL), wireless cellular, wireless data connectivity (e.g., WiFi™), T-carrier (e.g., T1), Ethernet, and so forth. In at least some implementations, the network 106 represents different interconnected wired and wireless networks.

The client device 102 includes a variety of different functionalities that enable various activities and tasks to be performed. For instance, the client device 102 includes an operating system 108, applications 110, a communication client 112a, and a wireless module 114a. Generally, the operating system 108 is representative of functionality for abstracting various system components of the client device 102, such as hardware, kernel-level modules and services, and so forth. The operating system 108, for instance, can abstract various components of the client device 102 to the applications 110 to enable interaction between the components and the applications 110.

The applications 110 represent functionalities for performing different tasks via the client device 102. Examples of the applications 110 include a word processing application, a spreadsheet application, a web browser, a gaming application, and so forth. The applications 110 may be installed locally on the client device 102 to be executed via a local runtime environment, and/or may represent portals to remote functionality, such as cloud-based services, web apps, and so forth. Thus, the applications 110 may take a variety of forms, such as locally-executed code, portals to remotely hosted services, and so forth.

The communication client 112a is representative of functionality to enable different forms of communication via the client device 102, such as for communication between the client device 102 and the endpoint device 104. Examples of the communication client 112a include a voice communication application (e.g., a VoIP client), a UC client, a video communication application, a messaging application, a content sharing application, and combinations thereof. The communication client 112a, for instance, enables different communication modalities to be combined to provide diverse communication scenarios. In at least some implementations, the communication client 112a represents an application that is installed on the client device 102. Additionally or alternatively, the communication client 112a can be implemented as a portal to a remote application, such as accessed via a web browser, a web application, and so forth.

According to one or more implementations, communication between the client device 102 and the endpoint device 104 occurs between the communication client 112a and a communication client 112b of the endpoint device 104. The communication client 112b, for instance, represents an instance of the communication client 112a. For example, a communication session between the client device 102 and the endpoint device 104 represents an exchange of communication media between the communication client 112a and the communication client 112b. In at least some implementations, the communication clients 112a, 112b represents applications that execute at an application layer of their respective devices.

The wireless module 114a of the client device 102 is representative of functionality for enabling the client device 102 to communicate data wirelessly over the network 106. For instance, the wireless module 114a represents hardware and logic for data communication over the network 106 via a variety of different wireless technologies and protocols.

The wireless module 114a includes an encoding module 116, which is representative of functionality to perform various encoding and decoding tasks for the client device 102. The encoding module 116, for example, is representative of functionality to perform various error correction coding, such as forward error correction (FEC). For instance, data that is to be wirelessly transmitted by the client device 102 is encoded by the encoding module 116 prior to transmission. Further, encoded data that is received by the client device 102 via a wireless signal is decoded by the encoding module 116 to reveal decoded data. The encoding module 116 includes an interleaver module 118, which is representative of functionality to perform interleaving of different types of data. For instance, the interleaver module 118 can interleave a data stream by shuffling bits of the data stream prior to the data stream being transmitted. Interleaving, for instance, is performed as part of FEC applied to a data stream. The interleaver module 118 is configured to operate in a variety of different interleaving modes, examples of which are discussed elsewhere herein. Further details concerning the encoding module 116 and the interleaver module 118 are discussed below.

The wireless module 114a includes other components not expressly illustrated herein, such as an encryption module for encrypting and decrypting data, a radio frequency (RF) modulator for modulating and demodulating data, RF components (e.g., antennas, radios, and so forth) for transmitting and receiving RF signal, and so forth.

The client device 102 further includes an encoding manager module 120a, which is representative of functionality to manage various aspects of encoding performed by the encoding module 116. For instance, the encoding manager 120a enables dynamic adjustment of correction encoding applied by the encoding module, such as in response to media type being transmitted, changes in signal quality, changes in network connectivity, and so forth. In at least some implementations, the encoding manager 120a is representative of functionality for performing various aspects of techniques for interleaving information for media data discussed herein.

The encoding manager 120a maintains an interleaving table 122 and a feedback table 124. According to various implementations, the interleaving table 122 is representative of functionality for storing and tracking attributes of data interleaving performed by the encoding module 116. The interleaving table 122, for instance, indicates default interleaving depth values for different types of communication media and/or combinations of communication media. In at least some implementations, the interleaving table 122 tracks an interleaving depth that is applied for interleaving encoded data for an active communication session. Further, the encoding manager 120a can dynamically adjust the interleaving depth for the communication session in the interleaving table 122 based on various events and changes that occur during the communication session.

The feedback table 124 is representative of functionality for storing and tracking various behaviors and parameters to be applied in response to feedback received regarding a communication session. For instance, the feedback table 124 specifies different interleaving depth adjustments to be applied in response to different types of feedback.

The environment 100 further includes a communication service 126, which is representative of a service to perform various tasks for management of communication between the client device 102 and the endpoint device 104. The communication service 126, for instance, can manage initiation, moderation, and termination of communication sessions. Examples of the communication service 126 include a VoIP service, an online conferencing service, a UC service, and so forth. In at least some implementations, the communication service 126 may be implemented as or be connected to a private branch exchange (PBX) in communication with a Public Switched Telephone Network ("PSTN") to enable voice communication between the client device 102 and the endpoint device 104.

According to one or more implementations, the communication clients 112a, 112b are managed and/or hosted by the communication service 126. For instance, the communication clients 112a, 112b represent interfaces to communication services provided by the communication service 126.

Further to the environment 100, the endpoint device 104 includes a wireless module 114b and an encoding manager 120b. The wireless module 114b is representative of functionality for performing various wireless-related tasks for the endpoint device 104. In at least some implementations, the wireless module 114b represents an instance of the wireless module 114a. For instance, the wireless module 114b is configured to perform data encoding and decoding, encryption and decryption, modulation and demodulation, and so forth. Thus, according to one or more implementations, attributes and functionalities discussed with reference to the wireless module 114a also apply to the wireless module 114b.

The encoding manager 120b is representative of functionality to manage various aspects of encoding and decoding performed by the wireless module 114b. In at least some implementations, the encoding manager 120b is configured to observe attributes of an incoming encoded data stream from the client device 102, and to provide feedback to the client device 102 to enable the client device 102 to dynamically adjust various aspects of data encoding performed by the encoding module 116b. For instance, as detailed below, the encoding module 116b can adjust an interleaving depth applied to encoded data that is to be wirelessly transmitted by the client device 102. In at least some implementations, adjusting the interleaving depth enables the encoding module 116*b* to account for variations in signal quality, such as to increase a likelihood that a receiving device can correctly decode data that is received from the client device 102.

The environment 100 further includes a quality service 128, which is representative of a network-based (e.g., cloud-based) service that provides encoding intelligence to various entities. For instance, the quality service 128 provides encoding intelligence to the communication service 126, the client device 102, and/or the endpoint device 104. The quality service 128 maintains an interleaving database (DB) 130, which is representative of functionality for storing various interleaving parameters and other information pertaining to interleaving. Examples of different types of interleaving data stored in the interleaving DB 130 are discussed below.

According to various implementations, the quality service 128 provides interleaving data from the interleaving DB 130 to the communication service 126, which forwards the interleaving data to the client device 102. The client device 102 stores the interleaving data as part of the interleaving table 122, and the interleaver module 118 utilizes the interleaving data to interleave data, such as communication session data to be transmitted wirelessly from the client device 102.

In at least some implementations, the quality service 128 represents a service that is implemented and managed by the communication service 126. Alternatively, the quality service 128 represents a standalone service that provides intelligence pertaining to interleaving to a variety of different services and/or devices.

The various entities and functionalities discussed in the environment 100 may be implemented in software, hardware, firmware, and/or combinations thereof. Further details and implementations of the various entities of the environment 100 are discussed below.

FIGS. 2 and 3 depict an example interleaving table 200 and an adjustment table 300, respectively, in accordance with one or more implementations. The interleaving table 200 and the adjustment table 300 represent interleaving data that is stored by the interleaving DB 130. According to various implementations, data from the interleaving table 200 and the adjustment table 300 is propagated from the quality service 128 to the communication service 126, which forwards the data to the client device 102 for use in interleaving data. For instance, data from the interleaving table 200 is stored as part of the interleaving table 122. Further, data from the adjustment table 300 is stored as part of the feedback table 124.

Generally, the interleaving table 200 specifies various interleaving depth values and interleaving modes to be applied for interleaving data of a communication session. The depth values, for instance, vary according to types of communication media involved in a communication session. The interleaving table 200 includes a media type column 202, a default depth column 204, and a max depth column 206. The media type column 202 includes different types of media that can be communicated as part of a communication session, such as voice data, video data, file sharing, text, and so forth.

The default depth column 204 specifies default interleaving depths to be applied to interleaving data of different media types. When a data stream is to be interleaved, for example, the encoding manager 120*a* identifies a media type included in the data stream, and selects an interleaving depth for interleaving the data stream based on a default interleaving depth specified in the default depth column 204 for the media type. For instance, for voice data the default depth column 204 specifies a default interleaving depth of D1, for video a default depth of D2, for file sharing and text a default interleaving depth of D3, and so forth. Voice data is typically more sensitive to latency issues that can occur in response to interleaving, so in one or more implementations D1 is the smallest of the default depth values. For instance, D1<D2<D3.

The max depth column 206 specifies a maximum interleaving depth that may be applied for each of the media types specified in the media type column 202. For instance, for voice data the max depth column specifies a maximum interleaving depth of M1, for video a maximum depth of M2, for file sharing and text a maximum interleaving depth of M3, and so forth.

Voice data is typically more sensitive to latency issues that can occur in response to interleaving, so in one or more implementations M1 is the smallest of the maximum depth values. For instance, M1<M2<M3. In at least some implementations, the depth values specified in the max depth column 206 are enforced such that the encoding module 116 may not exceed the specified interleaving depth for a particular media type when interleaving a data stream of the media type. The encoding module 116, for example, may not exceed an interleaving depth of M1 when interleaving a data stream of voice data.

The interleaving table 200 further includes a network type column 208 and an interleaving mode column 210. The network type column 208 identifies different types of networks over which data may be communicated. Examples of different network types include broadband cable, DSL, wireless cellular, wireless data connectivity (e.g., WiFi™), T-carrier (e.g., T1), Ethernet, and so forth. The interleaving mode column 210 specifies different interleaving modes to be used for different interleaving scenarios. For instance, a particular interleaving mode may be better suited to a particular network type and/or network condition than another interleaving mode. Thus, interleaving mode may be dynamically selected based on a network type being used to transmit data. Examples of different interleaving modes include a block interleaving mode, a convolutional interleaving mode, a random interleaving mode, a prime interleaving mode, a tree-based interleaving mode, and so forth.

The interleaving table 200 further includes a version indicator 212 which identifies a version for this particular instance of the interleaving table 200. For instance, each time data of the interleaving table 200 is updated, the version indicator 212 is incremented to indicate that the interleaving table has been updated. The version indicator 212 may be specified in various ways, such as a versioning number, a date on which the interleaving table 200 is updated, and so forth.

Continuing to the FIG. 3, the adjustment table 300 includes a feedback column 302 and the depth adjustment column 304. The feedback column 302 specifies different types of feedback that can be detected in response to wireless signal. For instance, the feedback column 302 identifies different signal qualities and attributes that can be detected by a receiving device, such as by the endpoint device 104 for wireless signal transmitted by the client device 102.

In this particular example, the feedback column 302 includes example feedback values of bursty acceptable, bursty poor, and acceptable. Generally, bursty refers to errors that are detected in data that have a bursty (e.g., non-random) distribution within the data. The wireless module 114a and/or the encoding manager 120a, for instance, are configured to inspect error distribution within a data stream received via a wireless signal, and to characterize the error distribution as either bursty or random. According to one or more implementations, acceptable signal and poor signal are distinguishable by comparing relative signal quality. For instance, a poor signal may exceed a data error threshold and/or have an average receive power that is below a receive power threshold. A data error threshold may be specified in various ways, such as in terms of a threshold data error rate, a threshold number of data errors, a threshold jitter value, and so forth. Further, an acceptable signal may be below a data error threshold and/or have an average receive power that is above a power threshold.

Accordingly, a signal that is indicated as being bursty acceptable may be determined to have a bursty error distribution but with a data quality that is acceptable. A signal that indicated as bursty poor may be determined to have a bursty error distribution with a data quality that is poor, e.g., not acceptable. Further, a signal that is indicated as being acceptable may be determined to have a non-bursty (e.g., random) error distribution and have a signal quality that is acceptable. These particular signal characterizations are provided for purpose of example only, and is to be appreciated that signal quality and other signal attributes may be defined in a variety of different ways in accordance with the claimed implementations.

The depth adjustment column 304 specifies interleaving depth adjustment values to be applied by the interleaver module 118 based on signal feedback. For instance, for a wireless signal that is determined to be bursty poor, a depth adjustment value of A1 is applied to increase a current interleaving value for the wireless signal. Further, for a wireless signal that is determined to be bursty acceptable, a depth adjustment value of A2 is applied to increase a current interleaving value for the wireless signal. For wireless signal that is determined to be acceptable (e.g., non-bursty), a depth adjustment value of zero (0) is specified. For instance, no interleaving depth adjustment is applied for wireless signal determined to have an acceptable signal quality. According to various implementations, 0<A2<A1.

The feedback column 302 further includes different velocity values "Velocity <V" and "Velocity ≥V." Generally, the velocity values specify an estimated velocity of movement of a device that is transmitting interleaved data, e.g., the client device 102. Further, the constant V represents a threshold velocity. Velocity may be specified in various ways, such as meters/second, miles/hour, and so forth. Based on changes in velocity, interleaving depth may be adjusted. For instance, if a device is moving at a velocity less than V, no velocity-based adjustment to interleaving is performed. However, if a device is moving at a velocity equal to or greater then V, a depth adjustment value of −A1 is applied to decrease an interleaving depth being applied. Generally, −A1<0. For instance, movement at a velocity ≥V decreases the likelihood that bursty errors will be introduced into data being transmitted, such as by increasing the randomness of interference due to changing environmental conditions caused by movement.

According to various implementations, increasing an interleaving depth increases the likelihood that wireless data can be correctly decoded by a receiving device. However, increasing an interleaving depth also increases a signal latency at a receiving device. Thus, in at least some implementations, a depth adjustment to interleaving of a wireless signal is not permitted to exceed a maximum interleaving depth specified in the max depth column 206 of the interleaving table 200.

The adjustment table 300 further includes a version indicator 306 which identifies a version for this particular instance of the adjustment table 300. For instance, each time data of the adjustment table 300 is updated, the version indicator 306 is incremented to indicate that the adjustment table has been updated. The version indicator 306 may be specified in various ways, such as a versioning number, a date on which the adjustment table 300 is updated, and so forth.

Having described an example environment in which the techniques described herein may operate, consider now an example implementation scenario for interleaving information for media data in accordance with one or more embodiments.

Example Implementation Scenario

The following section describes an example implementation scenario for interleaving information for media data in accordance with one or more embodiments. The implementation scenario may be implemented in the environment 100 discussed above, and/or any other suitable environment.

Figure 4:
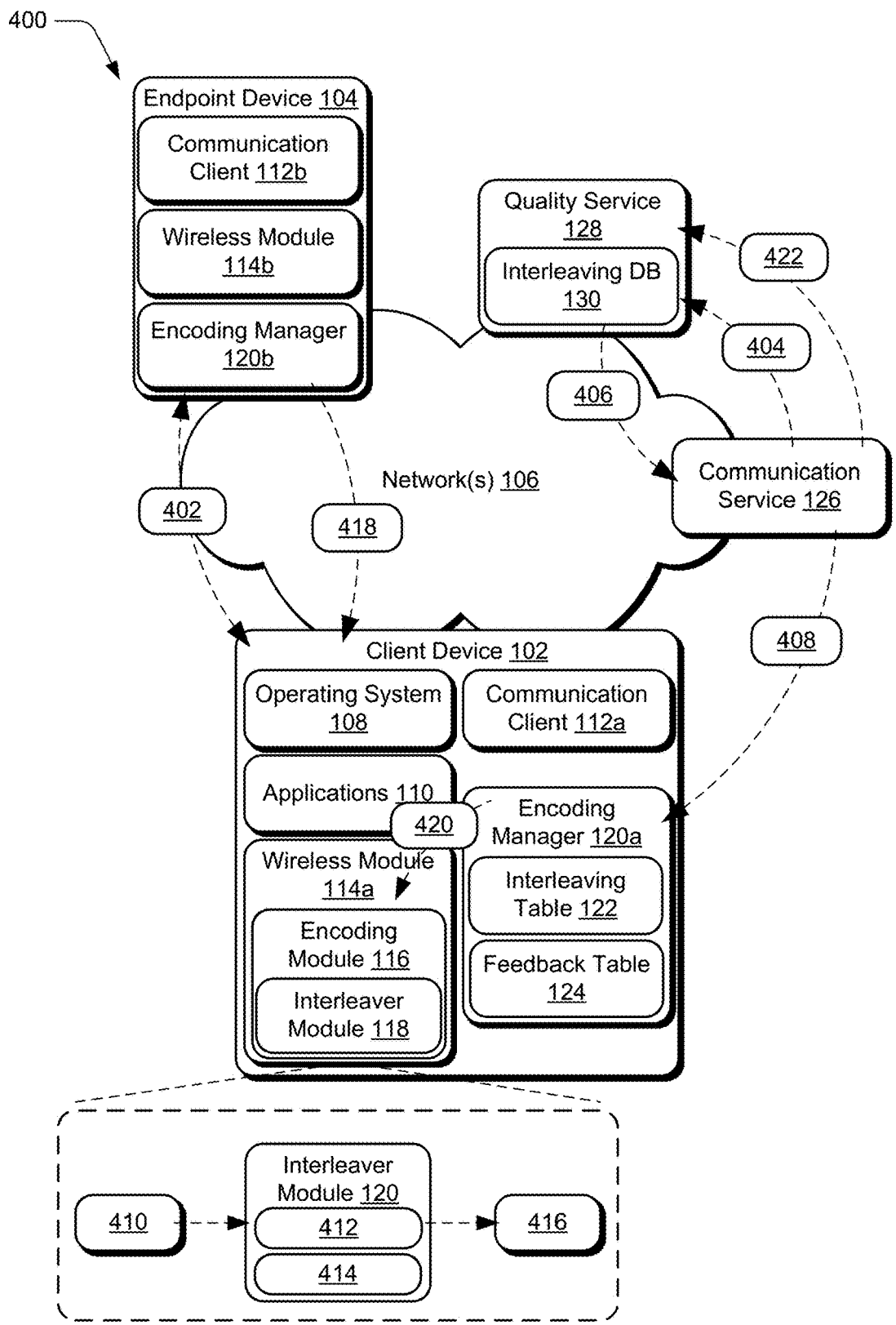
FIG. 4 depicts an example implementation scenario for determining an interleaving depth for data of a communication session in accordance with one or more embodiments.

FIG. 4 depicts an example implementation scenario 400 for determining an interleaving depth for data of a communication session in accordance with one or more implementations. In the scenario 400, the client device 102 engages in a communication session 402 with the endpoint device 104. The communication session 402, for instance, represents an exchange of communication media between the communication clients 112a, 112b. Examples of the communication session 402 include a VoIP call, a video call, a UC session, and/or combinations thereof.

Further to the scenario 400, the communication session 402 is initiated and/or managed via interaction between the communication client 112a and the communication service 126. Thus, the communication service 126 has knowledge of attributes of the communication session 402, such as identities of entities involved (e.g., users, devices, and so forth), media type(s) included, networks and network types that the communication session 302 traverses, locations of the devices involved, and so forth. Accordingly, the communication service 126 communicates an interleaving query 404 to the quality service 128 for interleaving information to be used for interleaving data of the communication session 402. The interleaving query 404, for example, specifies various attributes of the communication session 402, such as media type(s) and network type involved.

The quality service 128 returns an interleaving response 406 to the communication service 126 that includes interleaving data to be used for different scenarios. For instance, the interleaving response 406 includes interleaving depth values to be used for different types and combinations of communication media, interleaving modes, interleaving adjustment values to be applied based on different types of feedback, and so forth. Examples of interleaving data that may be included in the interleaving response 406 are discussed above with reference to the interleaving table 200 and the adjustment table 300.

Continuing with the scenario 400, the communication service 126 communicates an interleaving notification 408 to the client device 102 that includes interleaving data to be used for interleaving data of the communication session 402. The interleaving notification 408, for instance, includes interleaving data received from the quality service 128 as part of the interleaving response 406. Accordingly, the encoding manager 120a saves the interleaving data as part of the interleaving table 122 and/or the feedback table 124. Thus, the interleaver module 118 may utilize interleaving depths and modes specified in the interleaving table 122 for interleaving data, and may adjust interleaving depths based on adjustment values specified in the feedback table 124.

Generally, communication media of the communication session 402 is communicated to the endpoint device 104 via a wireless connection between the client device 102 and the network 106. Prior to be transmitted by the client device 102, however, media data 410 of the communication session 402 is encoded by the encoding module 116 and the encoded data is interleaved by the interleaver module 118 according to an interleaving depth 412 and utilizing an interleaving mode 414.

The interleaving depth 412, for instance, is ascertained by matching a media type for the communication session 402 to a default interleaving depth specified in the interleaving table 122 for the media type. For example, the communication client 112*a* and/or the communication service 126 communicate a notification to the encoding manager 120*a* specifying one or more media types involved in the communication session 302. The encoding manager 120*a* then searches the interleaving table 122 with the media type(s) to select the interleaving depth 412 to be applied to data of the communication session 402. The encoding manager further selects the interleaving mode 414, such as based on a network type for a network over which the client device 102 is communicating data of the communication session 402. The encoding manager 120*a* communicates the interleaving depth 412 and the interleaving mode 414 to the interleaver module 118, and the interleaver module 118 interleaves the media data 410 of the communication session 402 utilizing the interleaving mode 414 and according to the interleaving depth 412 to generate an interleaved data stream 416. The interleaved data stream 416 is transmitted wirelessly to the endpoint device 104 as part of the communication session 402.

In one or more implementations, the communication session 402 may include multiple media types, such as voice media and video media. Accordingly, in at least some implementations, when a media stream includes multiple media types, a lowest maximum interleaving depth for a media type included in the media stream can be enforced. For instance, a maximum interleaving depth for voice data may be less than a maximum interleaving depth for video data. Thus, for a media stream with voice and video data, the maximum interleaving depth for voice data may be enforced for the media stream. Alternatively, a communication session with multiple media types may be communicated via different data streams that each include a different media type. Thus, the individual data streams may be interleaved according to an interleaving depth specified for a media types included in the respective streams.

While not expressly depicted in the scenario 400, various other processing may be applied to the data 410 of the communication session 402 prior to transmission by the client device 102, such as encryption, modulation, and so forth.

Further to the scenario 400, the endpoint device 104 receives the data stream of the communication session 402 and performs various processing on the data stream. For instance, the wireless module 114*b* demodulates and decrypts the data stream to reveal the interleaved data stream 416. The wireless module 114*b* then de-interleaves the interleaved data stream 416 to reveal a de-interleaved data stream, and performs a decoding process on the de-interleaved data stream. For instance, the wireless module 114*b* performs FEC decoding on the de-interleaved data stream in an attempt to recover correct data bits of the communication session 402 that were originally encoded by the client device 102.

According to various implementations, the endpoint device 104 determines signal attributes of the data stream of the communication session 402, such as whether errors in the data stream are bursty or random, a signal quality of the data stream, and so forth. For instance, the wireless module 114*b* and/or the encoding manager 120*b* ascertain signal attributes of the data stream.

Generally, a signal quality of a data stream can be determined in various ways. For instance, the signal quality can be determined based on an error rate (e.g., a bit error rate) detected as part of FEC decoding. In at least some implementations, for example, a threshold error rate can be defined. Thus, a data stream that exceeds that threshold error rate can be characterized as having a poor signal quality. A data stream that does not exceed the threshold error rate can be characterized as having an acceptable and/or good signal quality.

Additionally or alternatively, signal quality can be determined based on average receive power for the signal. For instance, a data signal that has an average receive power that exceeds a threshold receive power can be characterized as having an acceptable signal quality. However, a data signal that has an average receive power that does not exceed the threshold receive power can be characterized as having a poor signal quality.

Continuing with the scenario 400, the endpoint device 104 returns signal feedback 418 to the client device 102. Generally, the signal feedback 418 specifies various attributes of the media stream for the communication session 402. Such attributes include signal quality, signal strength, error periodicity (e.g., whether errors in the signal are bursty or random), and so forth. The encoding manager 120*a* of the client device 102 receives the signal feedback 418 and determines whether to adjust the interleaving depth 412 based on the signal feedback 418.

In at least some implementations, the encoding manager 120*a* compares the signal feedback 418 to the feedback table 124 to ascertain whether and/or how the interleaving depth 412 is to be adjusted. For instance, the encoding manager 120*a* matches the signal feedback 418 to a signal feedback identified in the signal feedback column 302 of the adjustment table 300, and selects a corresponding depth adjustment value from the depth adjustment column 304. If the encoding manager 120*a* ascertains that the interleaving depth 412 is to be adjusted (e.g., increased), the encoding manager 120*a* communicates an interleaving adjustment value 420 to the interleaver module 118. However, if the encoding manager 120*a* ascertains that based on the signal feedback 418 the interleaving depth 412 is not to be adjusted, the encoding manager 120*a* does not communicate an interleaving adjustment value to the interleaver module 118.

Whether and how the interleaving adjustment value 420 is applied to the interleaving depth 412 may depend on a maximum interleaving value specified for a media type included in the media stream of the communication session 402. For instance, the interleaving adjustment value 420 may be applied to adjust the interleaving depth 412 up to a maximum interleaving value specified for the media type, such as specified by the interleaving table 124. Further, if the interleaving depth 412 is already at a specified maximum depth, the interleaving adjustment value 420 may not be applied to adjust the interleaving depth 412. In at least some implementations, if the interleaving depth 412 is at a maximum depth and signal quality of the communication session 402 is still determined to be poor, adjustment to FEC encoding of the communication session 402 may be implemented to attempt to increase signal quality.

Continuing with the scenario 400, the communication service 126 maintains state awareness of session attributes of the communication session, such as session quality experienced at the communication clients 112a, 112b. Accordingly, the communication service 126 provides performance feedback 422 to the quality service 128. Generally, the performance feedback 422 indicates attributes of the communication session 402, such as media type(s), network type(s), and so forth. The performance feedback 422 further includes interleaving parameters applied during the communication session 402, such as interleaving depth, interleaving mode, and so forth. The performance feedback 422 further specifies session quality experienced during the communication session 402, such as different error metrics, user experience metrics, network quality metrics, and so forth. In at least some implementations, the performance feedback 422 includes information from the signal feedback 418.

Accordingly, the quality service 128 may utilize the performance feedback 422 to modify the interleaving DB 130. For instance, if the performance feedback 422 indicates that a particular media type interleaved at a particular interleaving depth caused unacceptable media latency, the quality service 128 can decrease a default interleaving depth for the media type in the interleaving DB 130. Thus, the quality service 128 may utilize the performance feedback 422 to optimize the interleaving DB 130 to provide optimal interleaving information to devices across multiple networks and for a variety of different media types.

According to various implementations, the scenario 400 may be performed dynamically (e.g., periodically and/or continuously) while the communication session 402 is in progress. Thus, interleaving depth and mode may be adjusted dynamically and in real-time while the communication session 402 is in progress, such as to account for changes in signal attributes (e.g., signal strength, signal quality, and so forth), network type, and so forth, that occur during the communication session.

While the scenario 400 is discussed with reference to a query for interleaving information occurring in conjunction with a communication session, it is to be appreciated that implementations discussed herein may be employed to provide interleaving information to the client device 102 independently from an occurrence of a communication session.

For instance, the communication service 126 may periodically query the quality service 128 for updated interleaving data. If the quality service 128 indicates that updated interleaving data is available, the communication service 126 can obtain the updated interleaving data and propagate the updated data to the client device 102. In at least some implementations, determining whether updated interleaving data is available is performed by comparing a version indicator for interleaving data of the client device 102 with a version indicator for interleaving data available from the quality service 128. If this comparison indicates that updated interleaving information is available from the quality service 128, the updated information is propagated to the client device 102, such as by the communication service 126. Examples of suitable version indicators are discussed above with reference to the version indicators 212, 306.

As yet another example, the quality service 128 may push updated interleaving data to the communication service 126, e.g., independently of a query from the communication service 126 and/or the client device 102 for updated interleaving data. Thus, the communication service 126 may push the updated interleaving data to the client device 102, such as to augment and/or replace the interleaving table 124 and/or the feedback table 126.

While the scenario 400 is discussed with reference to increasing an interleaving depth in response to decreases in signal quality, it is to be appreciated that implementations discussed herein may be employed to decrease interleaving depth. For instance, the signal feedback 418 may indicate that signal quality for the communication session 402 is high. Thus, the encoding manager 120a may determine that based on the high signal quality, the interleaving depth 412 may be decreased. Decreasing the interleaving depth 412 may reduce latency in transmission of the communication session 402 and reduce processing bandwidth used to interleave the data stream of the communication session 402.

Accordingly, the scenario 400 illustrates that implementations discussed herein enable an interleaver configuration (e.g., depth, mode, and so forth) to be dynamically reconfigured in response to various events, such as initiation of a communication session, updates in interleaving data, changes in signal attributes (e.g., signal quality), changes in network type, and so forth. While the scenario 400 is discussed with reference to the communication service 126 acting as an intermediary, in at least some implementations the client device 102 may interact directly with the quality service 128 to obtain interleaving information and to provide session feedback.

Having discussed an example implementation scenario, consider now a discussion of some example procedures in accordance with one or more embodiments.

Example Procedures

The following discussion describes some example procedures for interleaving information for media data in accordance with one or more embodiments. The example procedures may be employed in the environment 100 of FIG. 1, the system 1400 of FIG. 14, and/or any other suitable environment. The procedures, for instance, represent procedures for implementing aspects of the example implementation scenario discussed above. In at least some implementations, the steps described for the various procedures can be implemented automatically and independent of user interaction.

Figure 5:
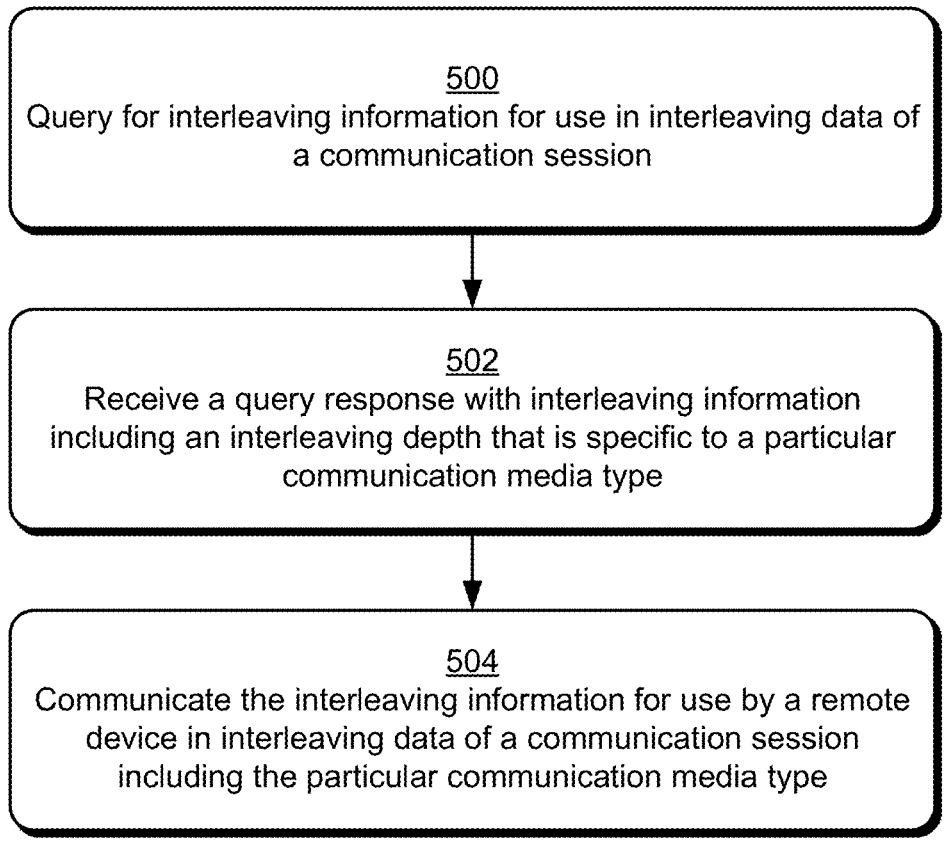
FIG. 5 is a flow diagram that describes steps in a method for communicating interleaving information in accordance with one or more embodiments.

FIG. 5 is a flow diagram that describes steps in a method in accordance with one or more embodiments. The method describes an example procedure for communicating interleaving information in accordance with one or more implementations. In at least some implementations, the method is performed at a network-based service, such as at the communication service 126 and/or the quality service 128.

Step 500 queries for interleaving information for use in interleaving data of a communication session. The communication service 126, for example, queries the quality service 128 for interleaving information. The query, for instance, represents a query to a remote service for interleaving information. Alternatively, the query represents an internal query, such as a query by the quality service 128 to the interleaving DB 130. As mentioned above, the quality service 128 may be implemented as a standalone service independent of the communication service 126, or may be implemented as a service provided by the communication service 126.

In at least some implementations, the query includes attributes of a communication session, such as media type(s) included in the communication session, network type(s) involved, and so forth. The query may also include a version indicator indicating a version for interleaving information that was previously retrieved. For instance, the communication service 126 includes a version indicator in the query to the quality service 128 for communication information. The version indicator, for example, identifies a version of interleaving information that was previously retrieved from the quality service 128 and communicated to the client device 102. Thus, the quality service 128 may ascertain based on the version indicator whether an updated version of interleaving information is available.

Step 502 receives a query response with interleaving information including an interleaving depth that is specific to a particular communication media type. The communication service 126, for instance, receives a query response from the quality service 128 that includes various interleaving information. The interleaving information, for instance, identifies an interleaving depth to be used for a particular communication media type. Various other types of interleaving information may also be included, such as an interleaving mode, interleaving adjustments to be applied based on feedback, and so forth. Examples of different interleaving information that may be included in the query response are discussed above.

Step 504 communicates the interleaving information for use by a remote device in interleaving data of a communication session including the particular communication media type. The communication service 126, for instance, communicates the interleaving information to the client device 102. The client device 102 may utilize the interleaving information for interleaving media data of a communication session with the endpoint device 104.

Figure 6:
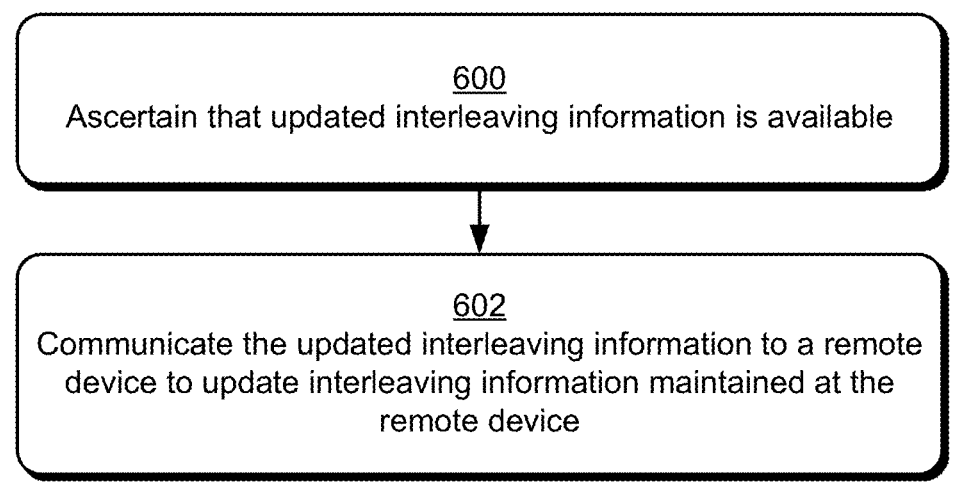
FIG. 6 is a flow diagram that describes steps in a method for communicating updated interleaving information in accordance with one or more embodiments.

FIG. 6 is a flow diagram that describes steps in a method in accordance with one or more embodiments. The method describes an example procedure for communicating updated interleaving information in accordance with one or more implementations. In at least some implementations, the method is performed at a network-based service, such as at the communication service 126 and/or the quality service 128.

Step 600 ascertains that updated interleaving information is available. The communication service 126, for instance, queries the quality service 128 to ascertain whether updated interleaving information is available. For example, the communication service 126 queries the quality service 128 with a version indicator that identifies a most recent version of interleaving information that was communicated to the client device 102. The communication service 126 returns a query response to the communication service 126 that includes updated interleaving information. The updated interleaving information, for example, has a version indicator that is more recent than the version indicator received as part of the query from the communication service 126.

Step 602 communicates the updated interleaving information to a remote device to update interleaving information maintained at the remote device. The communication service 126, for instance, communicates the updated interleaving information to the client device 102 to enable the client device 102 to utilize the updated interleaving information to interleave media data of a communication session with the endpoint device 104.

In at least some implementations, this method may be performed in various ways. For instance, the method may be performed periodically to keep interleaving information at the client device up-to-date, such as daily, weekly, and so forth. Alternatively or additionally, the method may be performed in response to a particular event, such as a query from the client device 102 for updated interleaving information, a prompt from the quality service 128 that updated interleaving information is available, and so forth.

In at least some implementations, the method may be performed dynamically and while a communication session is in progress. For instance, interleaving information maintained by the encoding manager 120a of the client device 102 may be updated dynamically while the client device 102 is engaged in a communication session. Further, the updated interleaving information may be applied dynamically to reconfigure an interleaving parameter being used for the communication session, such as an interleaving depth, an interleaving mode, and so forth.

Figure 7:
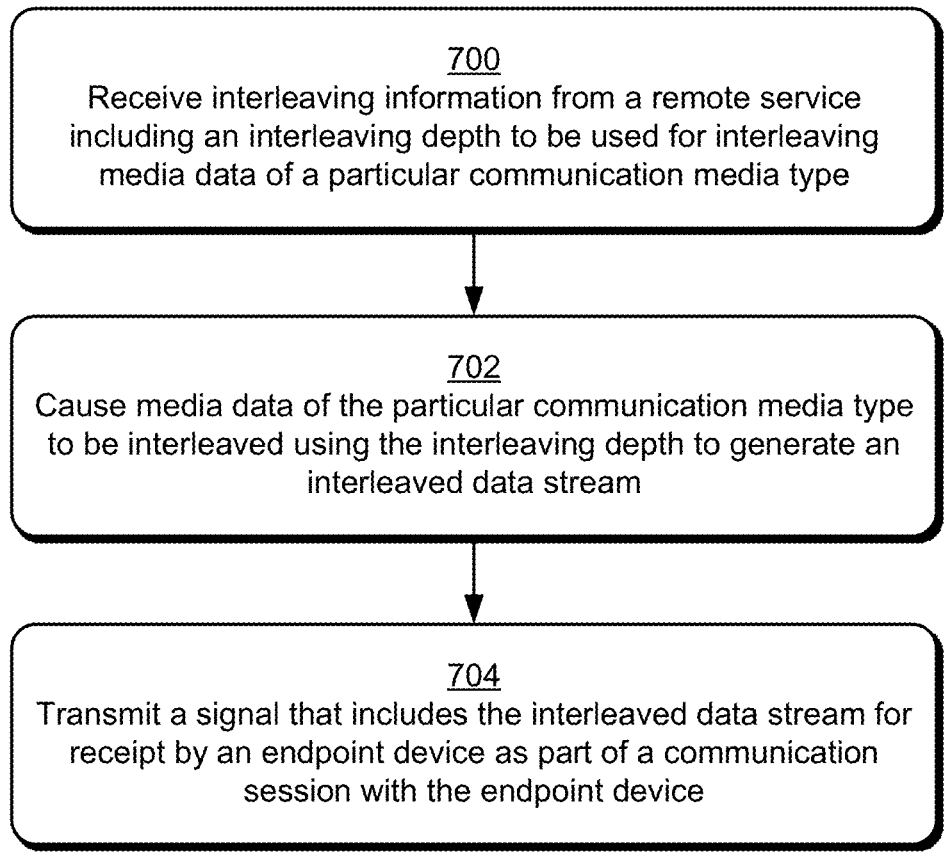
FIG. 7 is a flow diagram that describes steps in a method for applying an interleaving depth received from a remote resource for interleaving a data stream of a communication session in accordance with one or more embodiments.

FIG. 7 is a flow diagram that describes steps in a method in accordance with one or more embodiments. The method describes an example procedure for applying an interleaving depth received from a remote resource for interleaving a data stream of a communication session in accordance with one or more implementations. In at least some implementations, the method is performed at a transmitting device of a communication session, such as at the client device 102.

Step 700 receives interleaving information from a remote service including an interleaving depth to be used for interleaving media data of a particular communication media type. The client device 102, for instance, receives interleaving information from the communication service 126. The encoding manager 120a stores the interleaving information as part of the interleaving table 124 and/or the feedback table 126. The interleaving information includes different interleaving depths specified for different types of communication media. The interleaving information may also include a variety of other types of information, such as interleaving modes to be utilized based on different network conditions, interleaving adjustment values to be applied based on different session feedback, and so forth. In at least some implementations, the interleaving information represents an update that is used to augment and/or replace existing interleaving information.

Step 702 causes media data of the particular communication media type to be interleaved using the interleaving depth to generate an interleaved data stream. The interleaver module 118, for example, interleaves the particular type of media data according to the specified interleaving depth. In at least some implementations, the interleaver module 118 applies other types of interleaving information as part of interleaving the media data, such as a specified interleaving mode, an interleaving adjustment value, and so forth.

Step 704 transmits a signal that includes the interleaved data stream for receipt by an endpoint device as part of a communication session with the endpoint device. The interleaved data stream, for instance, is further processed after being interleaved, such as by encoding and modulating the interleaved data stream. The wireless module 114a then transmits the interleaved data stream as a wireless and/or wired signal over the network 106 for receipt by the endpoint device 104.

Figure 8:
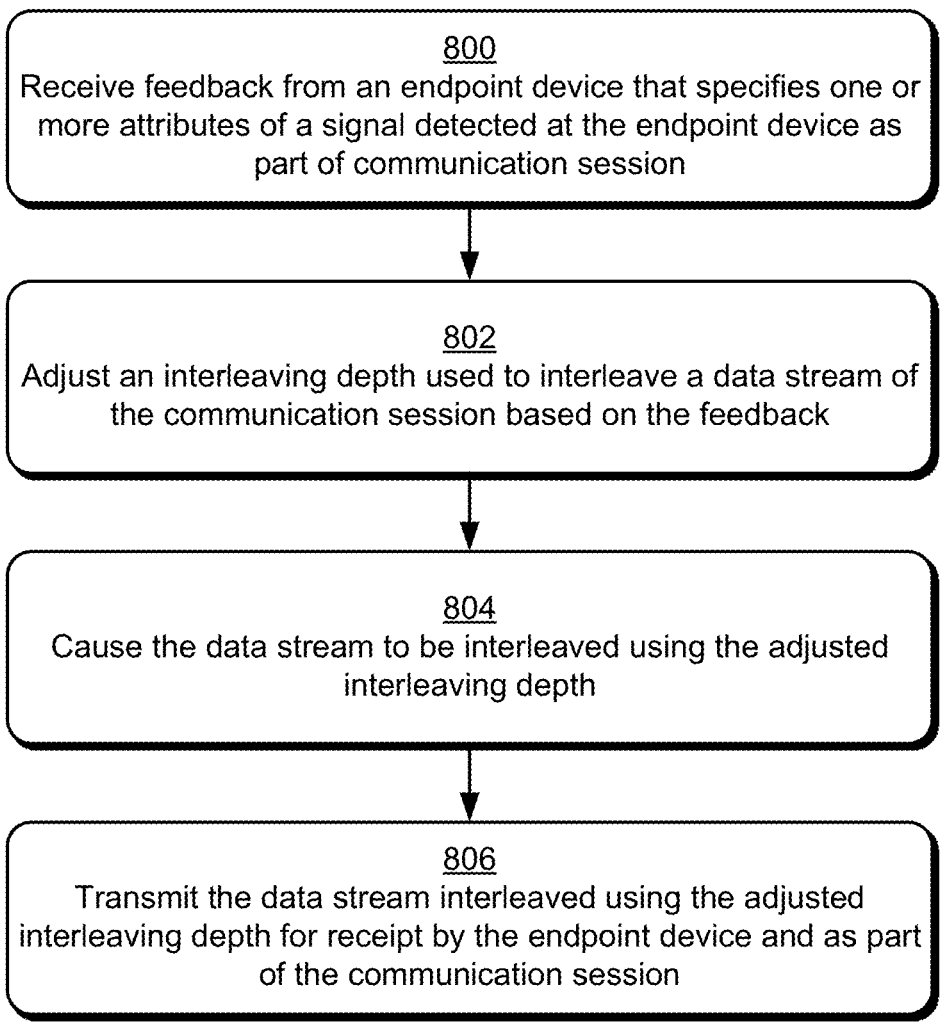
FIG. 8 is a flow diagram that describes steps in a method for adjusting interleaving of a data stream of a communication session in accordance with one or more embodiments.

FIG. 8 is a flow diagram that describes steps in a method in accordance with one or more embodiments. The method describes an example procedure for adjusting interleaving of a data stream of a communication session in accordance with one or more implementations. In at least some implementations, the method is performed at a transmitting device of a communication session, such as at the client device 102. The method, for instance, represents an extension of the method described above with reference to FIG. 7.

Step 800 receives feedback from an endpoint device that specifies one or more attributes of a signal detected at the endpoint device as part of communication session. The client device 102, for example, receives feedback from the endpoint device 104 specifying various attributes of the data stream of the communication session 402. In at least some implementations, the feedback is received as auxiliary data included with a data stream of the communication session transmitted by the endpoint device 104. Alternatively or additionally, the feedback may be received separately (e.g., out-of-band) from a data stream of the communication session.

According to various implementations, the feedback may specify a general quality of the data stream received at the endpoint device, such as "good," "acceptable," "poor," and so forth. Alternatively or additionally, the feedback may include quality and/or error statistics for the data stream. Example statistics that can be specified by the feedback include:

(1) Mean Opinion Score (MOS): This attribute can be leveraged to specify a MOS for a communication session. The attribute, for instance, can be used to indicate an overall quality of a communication session.

(2) Jitter Inter-Arrival Time: This attribute can be leveraged to specify jitter values for a communication session. The attribute, for instance, can be used to indicate that a jitter value or values have increased, e.g., have exceeded a specified jitter value threshold.

(3) Packet Loss Rate: This attribute can be leveraged to specify a packet loss rate for a communication session. The attribute, for instance, can be used to indicate that a packet loss rate has increased, e.g., has exceeded a specified packet loss rate value threshold.

(4) Packet Error Rate: This attribute can be leveraged to specify a packet error rate for a communication session. The attribute, for instance, can be used to indicate that a packet error rate has increased, e.g., has exceeded a specified packet error rate value threshold.

(5) Round Trip Delay (RTD): This attribute can be leveraged to specify RTD values for packets in communication sessions. The attribute, for instance, can be used to indicate that RTD values for packets have increased, e.g., have exceeded a specified RTD value threshold.

(6) Concealment Ratio: This attribute can be leveraged to specify a cumulative ratio of concealment time over speech time observed after starting a communication session. The attribute, for instance, can be used to specify that a concealment ratio has increased, e.g., has exceeded a specified concealment ratio value threshold.

Step 802 adjusts an interleaving depth used to interleave a data stream of the communication session based on the feedback. For instance, the encoding manager 120a ascertains based on the feedback that the data stream received at the endpoint device 104 is below a threshold quality. Thus, the encoding manager 120a increases the first interleaving depth to determine the second interleaving depth. The encoding manager 120a, for example, determines an adjustment value by comparing the signal quality to a depth adjustment value for the signal quality, such as using the feedback table 124.

In at least some implementations, the interleaving depth is adjusted subject to a maximum interleaving depth for the particular media type. For instance, an interleaving depth for the media type may not exceed a maximum specified interleaving depth for the media type.

Step 804 causes the data stream to be interleaved using the adjusted interleaving depth. The encoding manager 120a, for example, communicates the adjusting interleaving depth to the interleaver module 118, which utilizes the adjusted interleaving depth to interleave the data stream of the communication session. Thus, the interleaving depth is dynamically adjusted and applied to interleaving of the data stream while the communication session is in progress.

Step 806 transmits the data stream interleaved using the adjusted interleaving depth for receipt by the endpoint device and as part of the communication session. The client device 102, for instance, transmits the data stream over the network 106 for receipt by the endpoint device 104.

Figure 9:
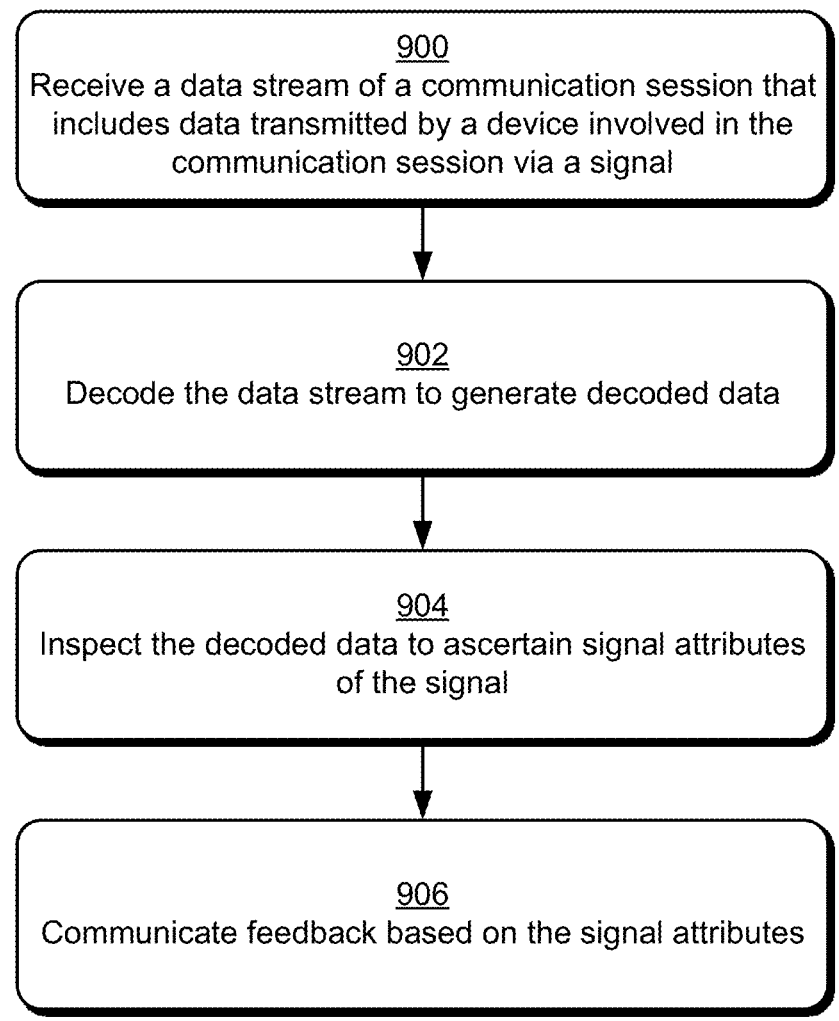
FIG. 9 is a flow diagram that describes steps in a method for generating feedback for a data stream of a communication session in accordance with one or more embodiments.

FIG. 9 is a flow diagram that describes steps in a method in accordance with one or more embodiments. The method describes an example procedure for generating feedback for a data stream of a communication session in accordance with one or more implementations. In at least some implementations, the method is an extension of the procedures described above. The method, for instance, may be performed at a receiving device in a communication session, such as by the endpoint device 104.

Step 900 receives a data stream of a communication session that includes data transmitted by a device involved in the communication session via a signal. The endpoint device 104, for instance, receives a data stream that includes data transmitted wirelessly by the client device 102 as part of a communication session between the endpoint device 104 and the client device 102.

Step 902 decodes the data stream to generate decoded data. The wireless module 114b, for example, performs various decoding processes on the data stream, such as demodulation, decryption, de-interleaving, FEC decoding, and so forth.

Step 904 inspects the decoded data to ascertain signal attributes of the signal. The wireless module 114b, for instance, inspects the decoded data for different types of errors and other signal properties, such as packet delay, packet loss rate, jitter, packet errors (e.g., number and/or rate), signal strength, and so forth. Alternatively or additionally, the wireless module 114b characterizes whether errors detected in the decoded data occur randomly or are bursty.

Step 906 communicates feedback based on the signal attributes. The feedback, for instance, identifies attributes, such as by identifying error types and/or quantifying errors. Alternatively or additionally, the feedback characterizes a signal quality of the wireless signal, such as "good," "acceptable," "bad," "bursty errors," "random errors," and so forth. In at least some implementations, the feedback is communicated to a device involved in the communication session, such as by the endpoint device 104 to the client device 102. Thus, the client device 102 may ascertain whether to perform an action based on the feedback, such as whether to adjust an interleaving depth, correction coding, and so forth.

Figure 10:
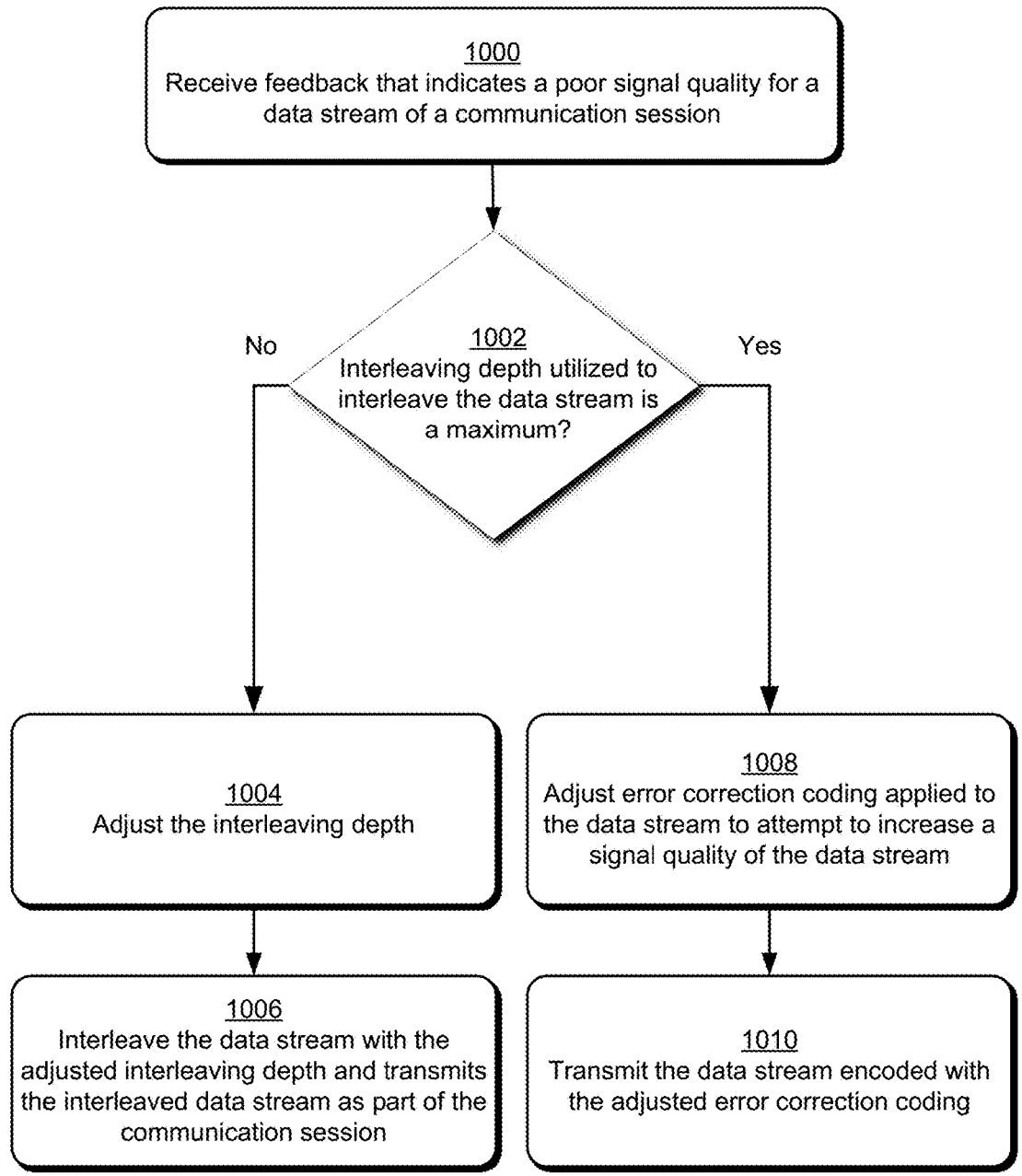
FIG. 10 is a flow diagram that describes steps in a method for adjusting error correction applied to a data stream of a communication session in accordance with one or more embodiments.

FIG. 10 is a flow diagram that describes steps in a method in accordance with one or more embodiments. The method describes an example procedure for adjusting error correction applied to a data stream of a communication session in accordance with one or more implementations. In at least some implementations, the method describes an extension and/or variation of the procedure described above with reference to FIG. 8.

Step 1000 receives feedback that indicates a poor signal quality for a data stream of a communication session. The client device 102, for instance, receives the feedback from the endpoint device 104 while the communication session 402 is in progress. In at least some implementations, the feedback pertains to a data stream that has been interleaved using an adjusted interleaving depth. For example, the feedback represents further feedback from the endpoint device 104.

Step 1002 ascertains whether an interleaving depth utilized to interleave the data stream is a maximum interleaving depth for a media type included in the media stream. The encoding manager 120*a*, for instance, compares the current interleaving depth to a maximum interleaving depth specified in the interleaving table 122 for the media type.

In an event that the interleaving depth is not a maximum interleaving depth for the media type ("No"), step 1004 adjusts the interleaving depth. The encoding manager 120*a*, for instance, increases the interleaving depth. According to various implementations, the interleaving depth may be increased up to the maximum interleaving depth. Generally, increasing the interleaving depth assists in increasing a signal quality for wireless signal received by the receiving device.

Step 1006 interleaves the data stream with the adjusted interleaving depth and transmits the interleaved data stream as part of the communication session. The data stream, for instance, is transmitted for receipt by an endpoint device involved in the communication session.

In an event that the interleaving depth is a maximum interleaving depth for the media type ("Yes"), step 1008 adjusts error correction coding applied to the data stream to attempt to increase a signal quality of the data stream. For instance, the encoding manager 120*a* notifies the encoding module 116 to decrease a coding rate of the data stream, such as an FEC coding rate. Generally, decreasing the code rate increases data redundancy of the data stream and thus increases the likelihood that bits of the data stream that are transmitted wirelessly can be correctly decoded by a receiving device.

Step 1010 transmits the data stream encoded with the adjusted error correction coding. The data stream, for instance, is transmitted for receipt by an endpoint device involved in the communication session.

Figure 11:
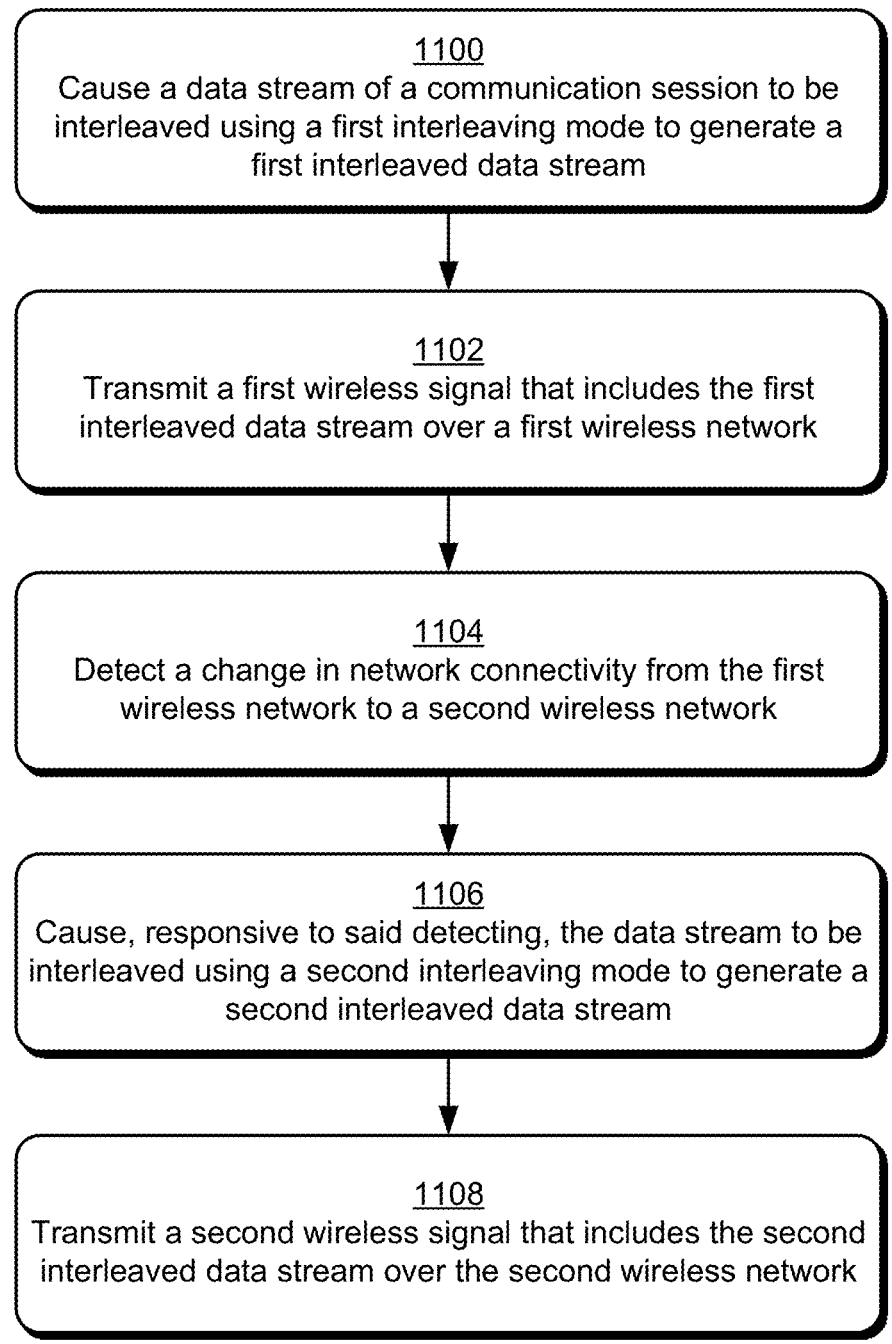
FIG. 11 is a flow diagram that describes steps in a method for changing an interleaving mode for data of a communication session in accordance with one or more embodiments.

FIG. 11 is a flow diagram that describes steps in a method in accordance with one or more embodiments. The method describes an example procedure for changing an interleaving mode for data of a communication session in accordance with one or more implementations.

Step 1100 causes a data stream of a communication session to be interleaved using a first interleaving mode to generate a first interleaved data stream. The interleaver module 118, for instance, interleaves the data stream according to an interleaving mode that is suitable to a particular wireless network over which a wireless signal including the data stream is transmitted. Examples of different interleaving modes are described above.

Step 1102 transmits a first wireless signal that includes the first interleaved data stream over a first wireless network. The first wireless signal, for instance, is transmitted for receipt by an endpoint device involved in the communication session. For example, the first wireless signal is transmitted by the client device 102 over a particular wireless network for receipt by the endpoint device 104.

Step 1104 detects a change in network connectivity from the first wireless network to a second wireless network. The client device 102, for instance, connects to a different network. For example, a wireless handover is performed for the communication session to a different wireless network. According to various implementations, the second wireless network is implemented via a different wireless technology than the first wireless network.

Step 1106 causes, responsive to said detecting, the data stream to be interleaved using a second interleaving mode to generate a second interleaved data stream. For example, the encoding manager 120*a* matches a network type for the second wireless network to the interleaving table 122 to determine an interleaving mode to be used. The second interleaving mode, for instance, is determined based on a wireless technology used to implement the second wireless network. Thus, the first interleaving mode and the second interleaving mode represent different interleaving modes. Generally, the second interleaved data stream includes data of the communication session.

Step 1108 transmits a second wireless signal that includes the second interleaved data stream over the second wireless network. The second wireless signal, for instance, is transmitted wirelessly and for receipt by an endpoint device as part of the communication session. Generally, the first interleaved data stream and the second interleaved data stream are generated as part of a single communication session, e.g., a single continuous communication session. Accordingly, a switch between interleaving modes used to interleave data of a communication session can be performed dynamically and seamlessly while the communication session is progress.

Figure 12:
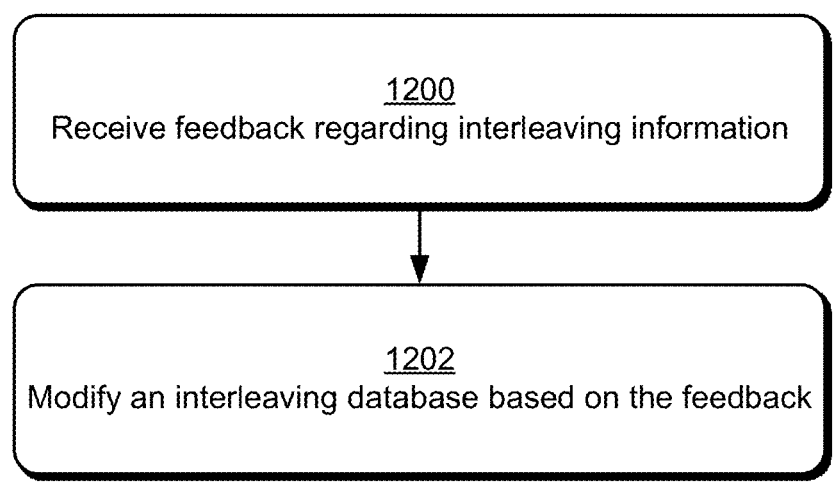
FIG. 12 is a flow diagram that describes steps in a method for modifying interleaving information in accordance with one or more embodiments.

FIG. 12 is a flow diagram that describes steps in a method in accordance with one or more embodiments. The method describes an example procedure for modifying interleaving information in accordance with one or more implementations.

Step 1200 receives feedback regarding interleaving information. The quality service 128, for instance, receives feedback regarding session quality experienced during a communication session, such as from the communication service 126 and/or the client device 102. Generally, the feedback correlates interleaving information such as interleaving depth and interleaving mode to media types and session quality. For example, the feedback specifies that for a particular interleaving depth and interleaving mode applied to a particular media type, a particular session quality was experienced. Session quality may be specified in different ways, such as errors experienced during a communication session, user feedback regarding session quality, and so forth. The feedback may include feedback regarding multiple different media types and across multiple different communication sessions. Examples of different types of feedback are detailed above.

Step 1202 modifies an interleaving database based on the feedback. The quality service 128, for instance, modifies (e.g., updates) the interleaving DB 130 based on the feedback. For example, the quality service 128 changes interleaving depth settings and/or mode settings based on the feedback. Consider, for example, that the feedback specifies that when a particular interleaving depth was applied to interleave a particular media type for a communication session, a threshold number of errors were detected in the media data. Accordingly, the quality service 128 may increase an interleaving depth specified for the media type in the interleaving DB 130. As another example, the feedback indicates that a particular media type interleaved at a particular interleaving depth caused unacceptable media latency. Accordingly, the quality service 128 can decrease a default interleaving depth for the media type in the interleaving DB 130. These particular examples are provided for purpose of illustration only, and it is to be appreciated that interleaving information may be modified in various ways and based on various types of feedback in accordance with implementations discussed herein.

Figure 13:
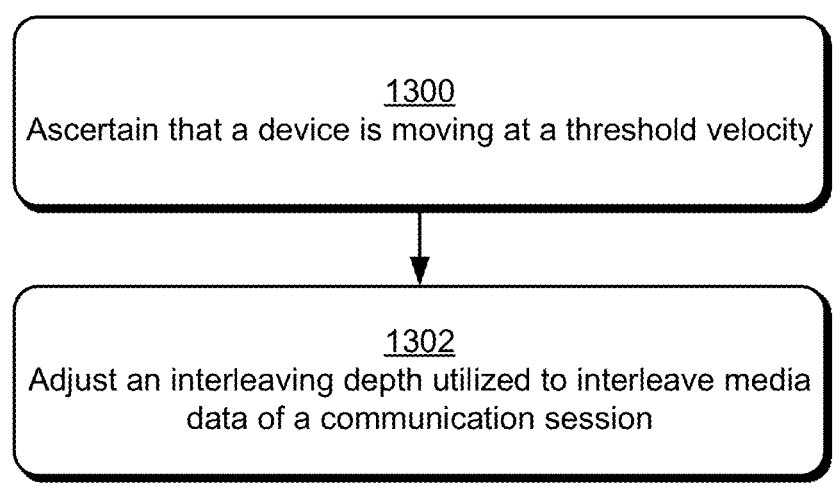
FIG. 13 is a flow diagram that describes steps in a method for adjusting interleaving depth based on velocity in accordance with one or more embodiments.

FIG. 13 is a flow diagram that describes steps in a method in accordance with one or more embodiments. The method describes an example procedure for adjusting interleaving depth based on velocity in accordance with one or more implementations.

Step 1300 ascertains that a device is moving at a threshold velocity. The client device 102, for instance, detects that it is moving at or above a threshold velocity.

Step 1302 adjusts an interleaving depth utilized to interleave media data of a communication session. For example, the client device 102 adjusts an interleaving depth utilized to interleave media data in response to ascertaining that the client device 102 is moving at or above the threshold velocity. The interleaving depth, for instance, may be adjusted dynamically while a communication session is in progress. Alternatively or additionally, the interleaving depth may be adjusted independently of a communication session, such as prior to initiating a communication session. Different aspects of interleaving depth adjustment based on velocity are discussed above.

Having discussed some example procedures, consider now a discussion of an example system and device in accordance with one or more embodiments.

Example System and Device

Figure 14:
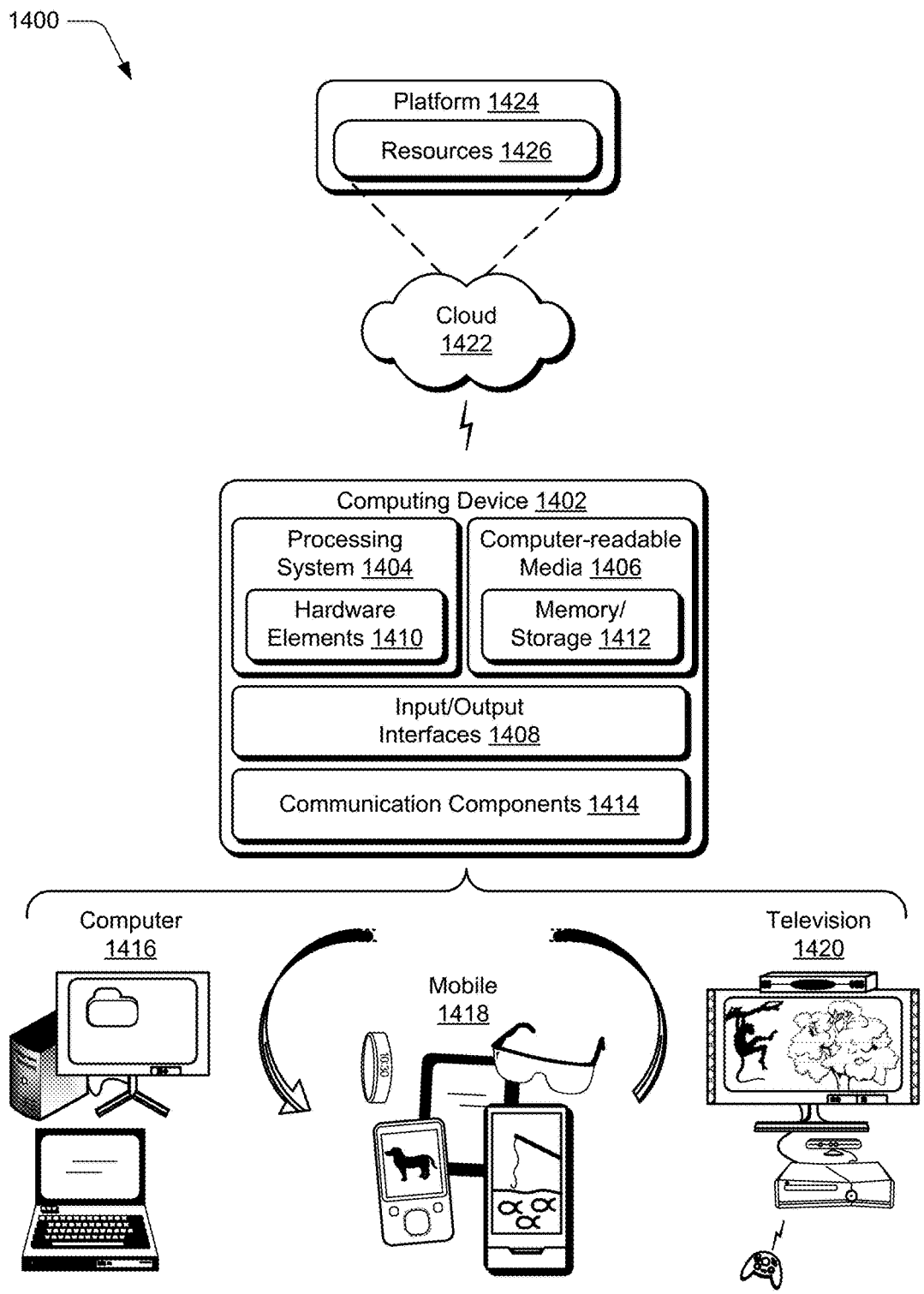
FIG. 14 illustrates an example system and computing device as described with reference to FIG. 1, which are configured to implement embodiments of techniques described herein.

FIG. 14 illustrates an example system generally at 1400 that includes an example computing device 1402 that is representative of one or more computing systems and/or devices that may implement various techniques described herein. For example, the client device 102, the endpoint device 104, the communication service 126, and/or the quality service 128 discussed above with reference to FIG. 1 can be embodied as the computing device 1402. The computing device 1402 may be, for example, a server of a service provider, a device associated with the client (e.g., a client device), an on-chip system, and/or any other suitable computing device or computing system.

The example computing device 1402 as illustrated includes a processing system 1404, one or more computer-readable media 1406, and one or more Input/Output (I/O) Interfaces 1408 that are communicatively coupled one to another. Although not shown, the computing device 1402 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1404 is representative of functionality to perform one or more operations using hardware. Accordingly, the processing system 1404 is illustrated as including hardware element 1410 that may be configured as processors, functional blocks, and so forth. This may include implementation in hardware as an application specific integrated circuit or other logic device formed using one or more semiconductors. The hardware elements 1410 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 1406 is illustrated as including memory/storage 1412. The memory/storage 1412 represents memory/storage capacity associated with one or more computer-readable media. The memory/storage 1412 may include volatile media (such as random access memory (RAM)) and/or nonvolatile media (such as read only memory (ROM), Flash memory, optical disks, magnetic disks, and so forth). The memory/storage 1412 may include fixed media (e.g., RAM, ROM, a fixed hard drive, and so on) as well as removable media (e.g., Flash memory, a removable hard drive, an optical disc, and so forth). The computer-readable media 1406 may be configured in a variety of other ways as further described below.

Input/output interface(s) 1408 are representative of functionality to allow a user to enter commands and information to computing device 1402, and also allow information to be presented to the user and/or other components or devices using various input/output devices. Examples of input devices include a keyboard, a cursor control device (e.g., a mouse), a microphone (e.g., for voice recognition and/or spoken input), a scanner, touch functionality (e.g., capacitive or other sensors that are configured to detect physical touch), a camera (e.g., which may employ visible or non-visible wavelengths such as infrared frequencies to detect movement that does not involve touch as gestures), and so forth. Examples of output devices include a display device (e.g., a monitor or projector), speakers, a printer, a network card, tactile-response device, and so forth. Thus, the computing device 1402 may be configured in a variety of ways as further described below to support user interaction.

The computing device 1402 further includes communication components 1414, which are representative of functionality to receive and transmit data for the computing device 1402. For instance, the communication components 1414 represent components for interfacing and communicating with a network, such as via any suitable wired and/or wireless protocol. According to various implementations, the communication components 1414 receive data transmitted to the computing device 1402 and route the data to one or more other components of the computing device 1402. Further, the communication components 1414 receive data from one or more internal components of the computing device 1402, and cause the data to be communicated to various entities (e.g., devices) remote from the computing device 1402.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1402. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Computer-readable storage media do not include signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1402, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, radio frequency (RF), infrared, and other wireless media.

As previously described, hardware elements 1410 and computer-readable media 1406 are representative of instructions, modules, programmable device logic and/or fixed device logic implemented in a hardware form that may be employed in some embodiments to implement at least some aspects of the techniques described herein. Hardware elements may include components of an integrated circuit or on-chip system, an application-specific integrated circuit (ASIC), a field-programmable gate array (FPGA), a complex programmable logic device (CPLD), and other implementations in silicon or other hardware devices. In this context, a hardware element may operate as a processing device that performs program tasks defined by instructions, modules, and/or logic embodied by the hardware element as well as a hardware device utilized to store instructions for execution, e.g., the computer-readable storage media described previously.

Combinations of the foregoing may also be employed to implement various techniques and modules described herein. Accordingly, software, hardware, or program modules and other program modules may be implemented as one or more instructions and/or logic embodied on some form of computer-readable storage media and/or by one or more hardware elements 1410. The computing device 1402 may be configured to implement particular instructions and/or functions corresponding to the software and/or hardware modules. Accordingly, implementation of modules that are executable by the computing device 1402 as software may be achieved at least partially in hardware, e.g., through use of computer-readable storage media and/or hardware elements 1410 of the processing system. The instructions and/or functions may be executable/operable by one or more articles of manufacture (for example, one or more computing devices 1402 and/or processing systems 1404) to implement techniques, modules, and examples described herein.

As further illustrated in FIG. 14, the example system 1400 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 1400, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 1402 may assume a variety of different configurations, such as for computer 1416, mobile 1418, and television 1420 uses. Each of these configurations includes devices that may have generally different constructs and capabilities, and thus the computing device 1402 may be configured according to one or more of the different device classes. For instance, the computing device 1402 may be implemented as the computer 1416 class of a device that includes a personal computer, desktop computer, a multi-screen computer, laptop computer, netbook, and so on.

The computing device 1402 may also be implemented as the mobile 1418 class of device that includes mobile devices, such as a mobile phone, portable music player, portable gaming device, a tablet computer, a wearable device, a multi-screen computer, and so on. The computing device 1402 may also be implemented as the television 1420 class of device that includes devices having or connected to generally larger screens in casual viewing environments. These devices include televisions, set-top boxes, gaming consoles, and so on.

The techniques described herein may be supported by these various configurations of the computing device 1402 and are not limited to the specific examples of the techniques described herein. For example, functionalities discussed with reference to the communication service 126 and the quality service 128 may be implemented all or in part through use of a distributed system, such as over a "cloud" 1422 via a platform 1424 as described below.

The cloud 1422 includes and/or is representative of a platform 1424 for resources 1426. The platform 1424 abstracts underlying functionality of hardware (e.g., servers) and software resources of the cloud 1422. The resources 1426 may include applications and/or data that can be utilized while computer processing is executed on servers that are remote from the computing device 1402. Resources 1426 can also include services provided over the Internet and/or through a subscriber network, such as a cellular or Wi-Fi network.

The platform 1424 may abstract resources and functions to connect the computing device 1402 with other computing devices. The platform 1424 may also serve to abstract scaling of resources to provide a corresponding level of scale to encountered demand for the resources 1426 that are implemented via the platform 1424. Accordingly, in an interconnected device embodiment, implementation of functionality described herein may be distributed throughout the system 1400. For example, the functionality may be implemented in part on the computing device 1402 as well as via the platform 1424 that abstracts the functionality of the cloud 1422.

Discussed herein are a number of methods that may be implemented to perform techniques discussed herein. Aspects of the methods may be implemented in hardware, firmware, or software, or a combination thereof. The methods are shown as a set of steps that specify operations performed by one or more devices and are not necessarily limited to the orders shown for performing the operations by the respective blocks. Further, an operation shown with respect to a particular method may be combined and/or interchanged with an operation of a different method in accordance with one or more implementations. Aspects of the methods can be implemented via interaction between various entities discussed above with reference to the environment 100.

Implementations discussed herein include:

Example 1

A system for communicating interleaving information for interleaving data of a communication session, the system including: at least one processor; and one or more computer-readable storage media including instructions stored thereon that, responsive to execution by the at least one processor, cause the system perform operations including: querying for interleaving information for use in interleaving data of a communication session; receiving a query response with interleaving information including an interleaving depth that is specific to a communication media type; and communicating the interleaving information for use by a remote device in interleaving data of a communication session including the particular communication media type.

Example 2

A system as described in example 1, wherein said querying is performed in response to initiation of the communication session.

Example 3

A system as described in one or more of examples 1 or 2, wherein said querying includes specifying the communication media type.

Example 4

A system as described in one or more of examples 1-3, wherein said querying includes specifying a network type for a network utilized for the communication session, and wherein the interleaving information includes an interleaving mode to be used for interleaving the data of the communication session for transmission over the network.

Example 5

A system as described in one or more of examples 1-4, wherein said querying includes a database query by an entity that maintains the database.

Example 6

A system as described in one or more of examples 1-5, wherein the interleaving information includes multiple different interleaving depths that are each specific to a different communication media type.

Example 7

A system as described in one or more of examples 1-6, wherein the interleaving information includes one or more interleaving adjustment values to be applied based on feedback regarding the communication session.

Example 8

A system as described in one or more of examples 1-7, wherein the operations further include: receiving feedback regarding the interleaving information; and causing an interleaving database to be updated based on the feedback.

Example 9

A computer-implemented method for utilizing interleaving data received from a remote service for interleaving media data of a communication session, the method including: receiving interleaving information from a remote service including an interleaving depth to be used for interleaving media data of a particular communication media type; causing media data of the particular communication media type to be interleaved using the interleaving depth to generate an interleaved data stream; and transmitting a signal that includes the interleaved data stream for receipt by an endpoint device as part of a communication session with the endpoint device.

Example 10

A method as described in example 9, wherein the communication session is implemented via an application that is executable at an application layer.

Example 11

A method as described in one or more of examples 9 or 10, wherein the interleaving information is received in response to initiation of the communication session.

Example 12

A method as described in one or more of examples 9-11, wherein the interleaving information is received independently from the communication session.

Example 13

A method as described in one or more of examples 9-12, wherein the interleaving information includes an interleaving mode, and wherein said causing includes causing the media data to be interleaved according to the interleaving mode.

Example 14

A method as described in one or more of examples 9-13, wherein the interleaving information includes an adjustment value for adjusting the interleaving depth based on feedback, and where the method further includes: receiving feedback specifying a poor signal quality for the communication session detected at the endpoint device; adjusting the interleaving depth to determine an adjusted interleaving depth; and causing media data of the particular communication media type to be interleaved using the adjusted interleaving depth and while the communication session is in progress.

Example 15

A method as described in one or more of examples 9-14, wherein the interleaving information includes an adjustment value for adjusting the interleaving depth based on feedback and a maximum interleaving depth for the particular communication media type, and where the method further includes: receiving feedback specifying a poor signal quality for the communication session detected at the endpoint device; adjusting the interleaving depth to determine an adjusted interleaving depth subject to the maximum interleaving depth for the particular communication media type; and causing media data of the particular communication media type to be interleaved using the adjusted interleaving depth and while the communication session is in progress.

Example 16

A method as described in one or more of examples 9-15, wherein the interleaving information includes an adjustment value for adjusting the interleaving depth based on feedback and a maximum interleaving depth for the particular communication media type, and where the method further includes: receiving feedback specifies a poor signal quality for the communication session detected at the endpoint device; ascertaining that the interleaving depth is at the maximum interleaving depth for the particular communication media type; and adjusting error correction coding applied to a data stream of the communication session to attempt to increase a signal quality of the data stream.

Example 17

A method as described in one or more of examples 9-16, wherein said causing is performed by a client device involved in the communication session, and wherein the further includes: ascertaining that the client device is moving at least at a threshold velocity; and adjusting the interleaving depth utilized to interleave the media data of the communication session based on said ascertaining.

Example 18

A computer-implemented method for communicating updated interleaving information for use in interleaving data of a communication session, the method including: ascertaining that updated interleaving information is available; and communicating the updated interleaving information to a remote device to update interleaving information maintained at the remote device and to enable the remote device to utilize the updated interleaving information to interleave media data of a communication session.

Example 19

A method as described in example 18, wherein said ascertaining occurs in response to a query for interleaving information submitted in response to initiation of the communication session.

Example 20

A method as described in one or more of examples 18 or 19, wherein said ascertaining includes comparing a version indicator for the interleaving information maintained at the remote device to a version indicator for the updated interleaving information to ascertain that the updated interleaving information is a more recent version than the interleaving information maintained at the remote device.

CONCLUSION

Techniques for interleaving information for media data are described. Although embodiments are described in language specific to structural features and/or methodological acts, it is to be understood that the embodiments defined in the appended claims are not necessarily limited to the specific features or acts described. Rather, the specific features and acts are disclosed as example forms of implementing the claimed embodiments.

What is claimed is:
1. A system comprising:
at least one processor; and
one or more computer-readable storage media including instructions stored thereon that, responsive to execution by the at least one processor, cause the system perform operations including:
querying for interleaving information for use in interleaving data of a communication session, said querying including identifying a media type to be communicated as part of the communication session;
receiving a query response with the interleaving information including an interleaving depth that is specific to a communication media type;
interleaving the data of the communication session using the interleaving depth specific to the communication media type from the query response;
receiving feedback related to a change in network connectivity after interleaving the data of the communication session; and
adjusting the interleaving depth based, in part, on the feedback related to the change in network connectivity.
2. A system as recited in claim 1, wherein said querying is performed in response to initiation of the communication session.
3. A system as recited in claim 1, wherein said querying includes specifying a network type for a network utilized for the communication session, and wherein the interleaving information includes an interleaving mode to be used for interleaving the data of the communication session for transmission over the network.
4. A system as recited in claim 1, wherein said querying comprises a database query by an entity that maintains the database.
5. A system as recited in claim 1, wherein the interleaving information includes multiple different interleaving depths that are each specific to a different communication media type.
6. A system as recited in claim 1, wherein the interleaving information includes one or more interleaving adjustment values to be applied based on feedback regarding the communication session.
7. A system as recited in claim 1, wherein after receiving the feedback related to the change in network connectivity, the operations further include:

causing an interleaving database to be updated based on the feedback.

8. A computer-implemented method comprising:
receiving interleaving information from a remote service including an interleaving depth to be used for interleaving media data of a particular communication media type;
causing the media data of the particular communication media type to be interleaved using the interleaving depth to generate an interleaved data stream;
transmitting a signal that includes the interleaved data stream for receipt by an endpoint device as part of a communication session with the endpoint device;
receiving feedback related to a change in network connectivity after interleaving the data of the communication session;
adjusting the interleaving depth based, in part, on the feedback related to the change in network connectivity; and
interleaving the media data of the particular communication media type using the adjusted interleaving depth.

9. A method as recited in claim 8, wherein the communication session is implemented via an application that is executable at an application layer.

10. A method as recited in claim 8, wherein the interleaving information is received in response to initiation of the communication session.

11. A method as recited in claim 8, wherein the interleaving information is received independently from the communication session.

12. A method as recited in claim 8, wherein the interleaving information includes an interleaving mode, and wherein said causing comprises causing the media data to be interleaved according to the interleaving mode.

13. A method as recited in claim 8, wherein said adjusting the interleaving depth is performed while the communication session is in progress.

14. A method as recited in claim 8, wherein the interleaving information includes an adjustment value for adjusting the interleaving depth based on the feedback and a maximum interleaving depth for the particular communication media type, and said adjusting the interleaving depth is at or below the maximum interleaving depth for the particular communication session.

15. A method as recited in claim 8, wherein the interleaving information includes an adjustment value for adjusting the interleaving depth based on the feedback and a maximum interleaving depth for the particular communication media type, and where the method further comprises:

ascertaining that the interleaving depth is at the maximum interleaving depth for the particular communication media type; and
adjusting error correction coding applied to a data stream of the communication session to attempt to increase a signal quality of the data stream.

16. A method as recited in claim 8, wherein said causing is performed by a client device involved in the communication session, and wherein the further comprises:
ascertaining that the client device is moving at least at a threshold velocity; and
adjusting the interleaving depth utilized to interleave the media data of the communication session based on said ascertaining.

17. A computer-implemented method comprising:
ascertaining that updated interleaving information is available to update previously-specified interleaving information for a communication session, the previously-specified interleaving information including an interleaving depth, the communication session including communication media of a particular type and the updated interleaving information including an updated interleaving depth to be used for the particular media type;
receiving feedback related to a change in network connectivity used for the communication session;
adjusting the interleaving depth based, in part, on the feedback related to the change in network connectivity and the updated interleaving information; and
interleaving media data of the communication session using the adjusted interleaving depth.

18. A method as described in claim 17, wherein said ascertaining occurs in response to a query for interleaving information submitted in response to initiation of the communication session.

19. A method as described in claim 17, wherein said ascertaining comprises comparing a version indicator for the interleaving information maintained at the remote device to a version indicator for the updated interleaving information to ascertain that the updated interleaving information is a more recent version than the interleaving information maintained at the remote device.

20. A system as recited in claim 1, wherein the interleaving depth that is specific to a communication media type is based in part on a delay tolerance for the communication media type.

* * * * *